United States Patent
Tamura et al.

(10) Patent No.: US 9,742,405 B2
(45) Date of Patent: Aug. 22, 2017

(54) SEMICONDUCTOR INTEGRATED CIRCUIT

(71) Applicant: FUJITSU LIMITED, Kawasaki-shi, Kanagawa (JP)

(72) Inventors: Hirotaka Tamura, Yokohama (JP); Hisanori Fujisawa, Kawasaki (JP); Hiroaki Fujimoto, Kawasaki (JP); Safeen Huda, Toronto (CA); Jason Anderson, Toronto (CA)

(73) Assignee: FUJITSU LIMITED, Kawasaki (JP)

( * ) Notice: Subject to any disclaimer, the term of this patent is extended or adjusted under 35 U.S.C. 154(b) by 458 days.

(21) Appl. No.: 14/339,509

(22) Filed: Jul. 24, 2014

(65) Prior Publication Data
US 2015/0061410 A1     Mar. 5, 2015

(30) Foreign Application Priority Data

Aug. 30, 2013    (JP) ................................ 2013-180056

(51) Int. Cl.
    *H01H 47/00*     (2006.01)
    *H01H 35/00*     (2006.01)
    (Continued)

(52) U.S. Cl.
    CPC ........... *H03K 19/0019* (2013.01); *G11C 5/06* (2013.01); *G11C 5/14* (2013.01); *Y10T 307/832* (2015.04)

(58) Field of Classification Search
    CPC .......... G09G 5/00; G09G 5/08; G06F 1/3203; G06F 1/3231; G06F 1/3259; G06F 1/30;
    (Continued)

(56) References Cited

U.S. PATENT DOCUMENTS 5,751,651 A  *  5/1998   Ooishi ..................... G11C 5/14
                                                         326/121
6,242,890 B1  *  6/2001   Sudo ..................... H02J 7/0063
                                                         320/127

(Continued)

FOREIGN PATENT DOCUMENTS

| JP | H09-026841 A | 1/1997 |
|---|---|---|
| JP | 2001-195163 A | 7/2001 |
| JP | 2002-313922 A | 10/2002 |
| JP | 2011-250107 A | 12/2011 |

OTHER PUBLICATIONS

Chan et al., "Uniform-Phase Uniform-Amplitude Resonant-Load Global Clock Distributions," IEEE Journal of Solid-State Circuits, vol. 40, No. 1, Jan. 2005, pp. 102-109.

(Continued)

*Primary Examiner* — Rexford Barnie
*Assistant Examiner* — Jagdeep Dhillon
(74) *Attorney, Agent, or Firm* — Arent Fox LLP

(57) ABSTRACT

A semiconductor integrated circuit includes: a first wire through which a signal is transmitted; a second wire that is not used for signal transmission; a switch that creates or breaks an electric connection between the first wire and the second wire; and a control circuit that controls the switch according to an potential of the signal, which is transmitted through the first wire, so that part of charge stored in a first wire capacitor of the first wire moves to a second wire capacitor of the second wire and is stored in the second wire capacitor and the charge stored in the second wire capacitor are drawn to the first wire capacitor to charge the first wire capacitor.

5 Claims, 27 Drawing Sheets

(51) Int. Cl.
*H01H 83/18* (2006.01)
*H02H 3/02* (2006.01)
*H02H 3/42* (2006.01)
*H03K 19/00* (2006.01)
*G11C 5/06* (2006.01)
*G11C 5/14* (2006.01)

(58) Field of Classification Search
CPC .. H02M 3/158; H02M 3/1588; H02M 3/1584; H02M 2001/009; H02M 2001/0009; G11C 5/06; G11C 5/00; H02J 7/00; H03K 19/0948; Y02B 70/16; Y02B 60/1282; Y02B 60/1278
USPC ........ 307/126, 60, 66, 64, 80; 345/173, 166, 345/156, 157, 163; 320/128, 127, 134, 320/136, 135; 365/51, 121, 226; 323/271, 273
See application file for complete search history.

(56) References Cited

U.S. PATENT DOCUMENTS

| | | | | |
|---|---|---|---|---|
| 6,661,410 B2* | 12/2003 | Casebolt | ............... | G06F 1/3203 178/18.01 |
| 6,850,229 B2* | 2/2005 | Casebolt | ............... | G06F 1/3203 178/18.06 |
| 6,995,747 B2* | 2/2006 | Casebolt | ............... | G06F 1/3203 178/18.01 |
| 2014/0145692 A1* | 5/2014 | Miyamae | ............... | H02M 3/158 323/271 |

OTHER PUBLICATIONS

McMurchie et al., "PathFinder: A Negotiation-Based Performance-Driven Router for FPGAs," Dept. of Computer Science and Engineering, University of Washington, Seattle, WA, 7 pages.
Japanese Office Action of related Japanese Patent Application No. 2013-180056 dated Feb. 28, 2017.

* cited by examiner

SEMICONDUCTOR INTEGRATED CIRCUIT

CROSS-REFERENCE TO RELATED APPLICATION

This application is based upon and claims the benefit of priority of the prior Japanese Patent Application No. 2013-180056 filed on Aug. 30, 2013, the entire contents of which are incorporated herein by reference.

FIELD

The embodiments discussed herein are related to a semiconductor integrated circuit.

BACKGROUND

A reconfigurable semiconductor integrated circuit such as a field-programmable gate array (FPGA) may implement a desired function by programming circuit configuration information to the semiconductor integrated circuit.

A reconfigurable semiconductor integrated circuit has a configurable logic block (CLB) including a plurality of basic logic elements, a switch block (SB), a connection block (CB), and wires that mutually connect these blocks. The semiconductor integrated circuit having these elements may connect the CLB in a programmable manner and thereby has longer wire lengths than an application-specific integrated circuit (ASIC), resulting in larger wire capacitance. Therefore, the wires in the semiconductor integrated circuit consume more power.

As a power saving technology applied to the ASIC field, a charge recycling technique is available.

When, in a logic circuit, the value of a signal changes from 1 to 0, all charge stored in a wire capacitor is released. If the value of the wire capacitance and a power supply voltage are respectively denoted C and $V_{DD}$, electric power consumed is represented as $CV_{DD}^2/2$. With a charge recycling technique, when stored charge is released, part of them is stored in another capacitor. The charge in the other capacitor is reused during a next change of the signal from 0 to 1 to reduce power consumption.

A clock resonance technique is available as a type of charge recycling technique. In the clock resonance technique, an inductor is added to a clock wire net; an LC resonant circuit is created according to the inductance of the inductor and the capacitance of a clock wire to produce resonance. Thus, charge is reused between the inductor and the clock wire capacitor, reducing electric power consumed in the clock wire net.

If the above conventional charge recycling technique is applied to a semiconductor integrated circuit, the circuit area becomes large. With a technique, for example, when stored charge is released during a discharge, part of the released charge is stored in another capacitor, so the addition of the other capacitor increases the circuit area accordingly. The clock resonance technique is also problematic in that the addition of the inductor increases the circuit area accordingly.

The following are reference documents:

[Document 1] Japanese Laid-open Patent Publication No. 2001-195163,
[Document 2] Japanese Laid-open Patent Publication No. 2011-250107,
[Document 3] S. Chan, K. Shepard, and P. Restle, "Uniform-Phase Uniform-Amplitude Resonant-Load Global Clock Distributions", Solid-State Circuits, IEEE Journal of, vol. 40, no. 1, pp. 102-109, January 2005, and
[Document 4] L. McMurchie and C. Ebeling, "Pathfinder: A Negotiation-Based Performance-Driven Router for FPGAs", in ACM/SIGDA International Symposium on Field Programmable Gate Arrays, Monterey, Calif., USA, 1995, pp. 111-117.

SUMMARY

According to an aspect of the invention, a semiconductor integrated circuit includes: a first wire through which a signal is transmitted; a second wire that is not used for signal transmission; a switch that creates or breaks an electric connection between the first wire and the second wire; and a control circuit that controls the switch according to an potential of the signal, which is transmitted through the first wire, so that part of charge stored in the first wire capacitor moves to a second wire capacitor and is stored in the second wire capacitor and the charge stored in the second wire capacitor are drawn to the first wire capacitor to charge the first wire capacitor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments of the present disclosure will be described below with reference to the drawings.

First Embodiment

Figure 1:
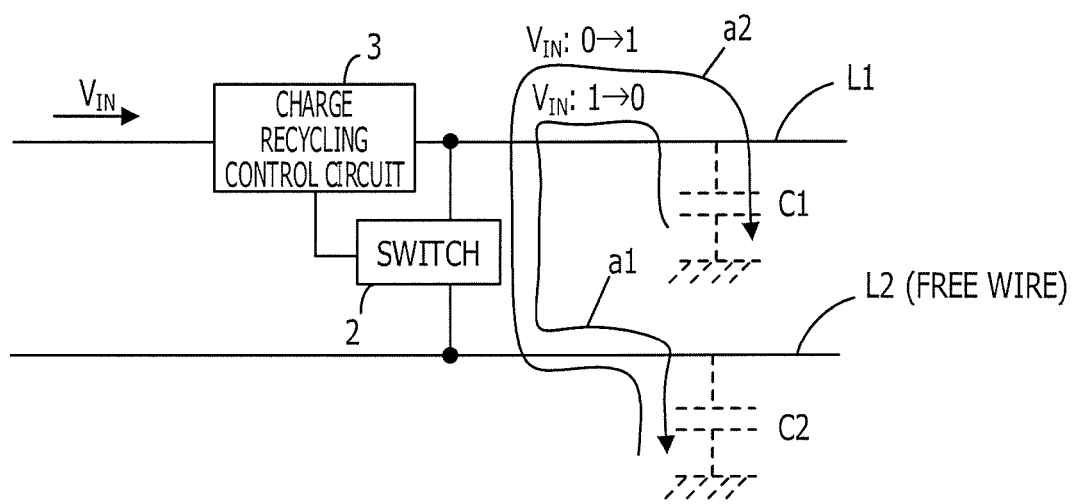
FIG. 1 illustrates an example of a semiconductor integrated circuit in a first embodiment.

FIG. 1 illustrates an example of a semiconductor integrated circuit in a first embodiment.

A semiconductor integrated circuit 1, which is reconfigurable as with an FPGA, has a plurality of wires, L1 and L2. In the example in FIG. 1, a signal $V_{IN}$ is transmitted through the wire L1, but no signal is transmitted through the wire L2, leaving the wire L2 as a free line (non-used wire). In a reconfigurable semiconductor integrated circuit, a free wire as described above is formed at, for example, a function design stage.

The semiconductor integrated circuit 1 further has a switch 2 that creates or breaks an electrical connection between the wire L1 and the non-used wire L2 and a charge recycling control circuit 3 that controls the switch 2.

The charge recycling control circuit 3 controls the switch 2 according to the potential of the signal $V_{IN}$, which is transmitted through the wire L1, so that part of charge stored in a wire capacitor C1 of the wire L1 moves to a wire capacitor C2 of the non-used wire L2 and is stored therein. When charging the wire capacitor C1, the charge recycling control circuit 3 draws stored charge to the wire capacitor C1 to reuse them in charging the wire capacitor C1. The charge recycling control circuit 3 further has a buffer circuit function; the charge recycling control circuit 3 stores the signal $V_{IN}$ and outputs it. The wire capacitors C1 and C2 are each a parasitic capacitor, so they are indicated by the dashed lines in FIG. 1.

When, for example, the signal $V_{IN}$ changes from 1 (the potential level is high (H)) to 0 (the potential level is low (L)), the charge recycling control circuit 3 turns on the switch 2 for a certain period. Thus, part of the charge stored in the wire capacitor C1 of the wire L1 moves to the wire capacitor C2 of the non-used the wire L2 and is stored therein as indicated by the arrow a1 in FIG. 1.

In a case as well in which the signal $V_{IN}$ changes from 0 to 1, the charge recycling control circuit 3 turns on the switch 2 for a certain period. Thus, part of the charge stored in the wire capacitor C2 of the free the wire L2 is drawn to the wire capacitor C1 of the wire L1 and is stored therein as indicated by the arrow a2 in FIG. 1.

An example of the operation of the semiconductor integrated circuit 1 in the first embodiment will be described below.

Figure 2:
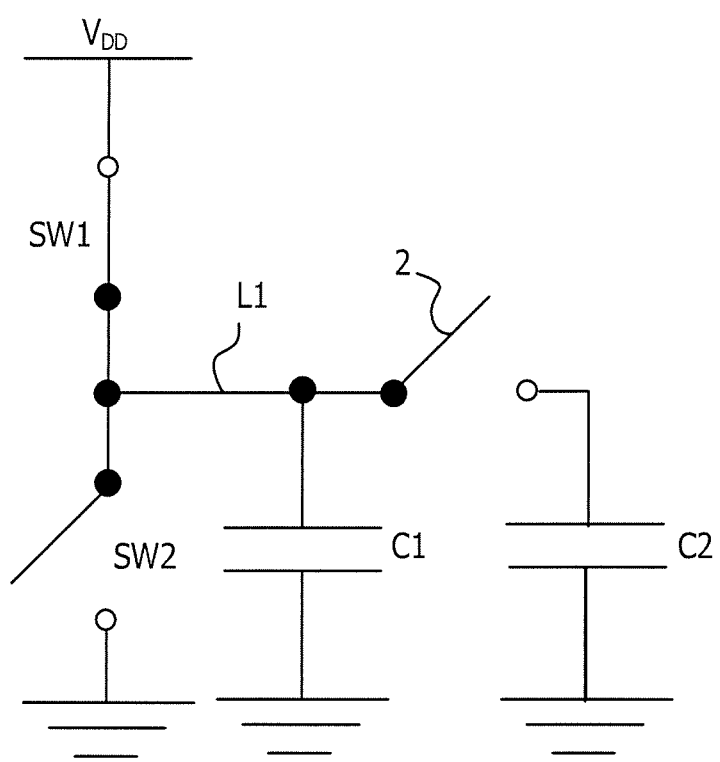
FIG. 2 illustrates charge recycling by the semiconductor integrated circuit in the first embodiment.
Figure 3:
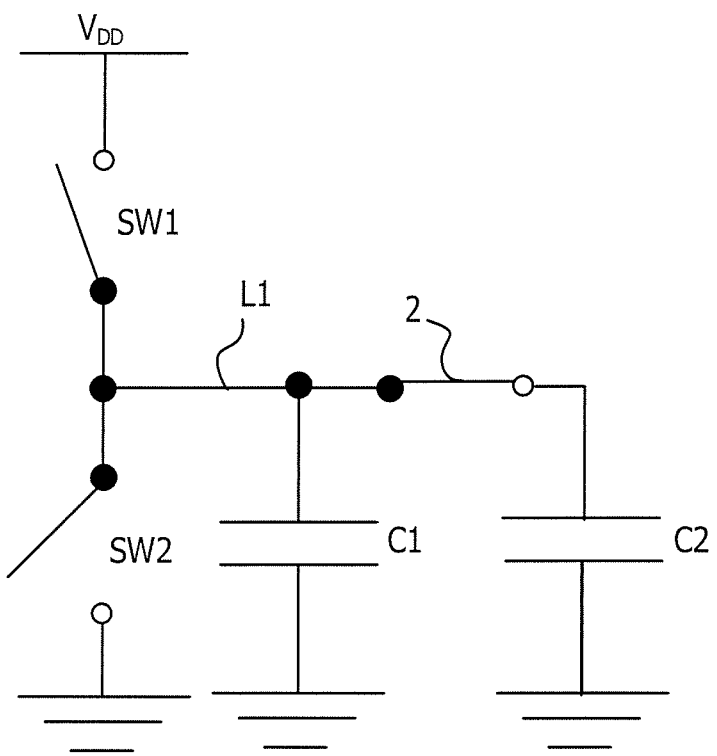
FIG. 3 also illustrates charge recycling by the semiconductor integrated circuit in the first embodiment.
Figure 4:
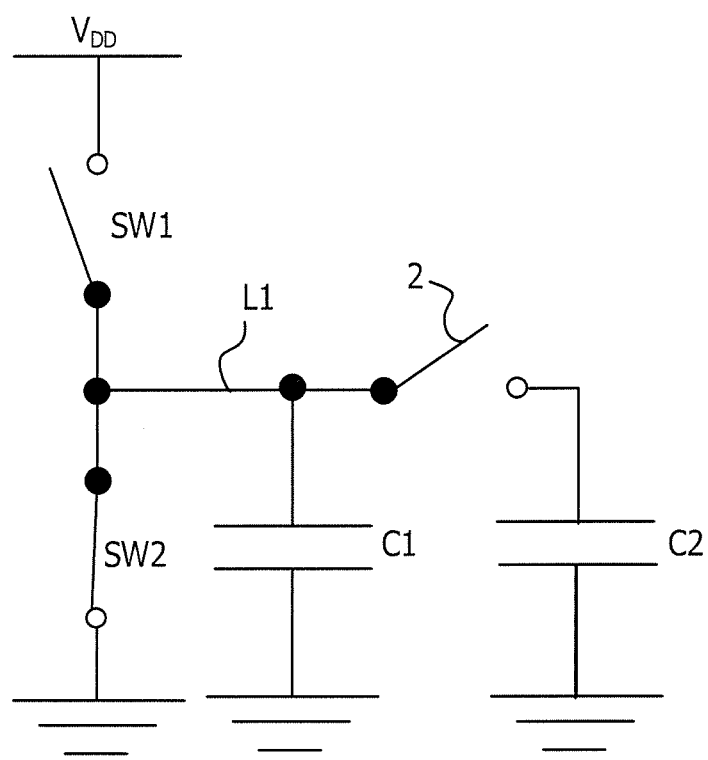
FIG. 4 also illustrates charge recycling by the semiconductor integrated circuit in the first embodiment.

FIGS. 2 to 4 illustrate charge recycling by the semiconductor integrated circuit in the first embodiment.

In FIGS. 2 to 4, switches SW1 and SW2 are illustrated together with the switch 2, the wire capacitor C1 of the wire L1, and the wire capacitor C2 of the wire L2 illustrated in FIG. 1. The switches SW1 and SW2, which are implemented by the charge recycling control circuit 3, connect the wire L1 to a power supply, which supplies a power supply voltage $V_{DD}$, or ground the wire L1 to a reference power supply (GND). Alternatively, the switches SW1 and SW2 disconnect the wire L1 from the power supply or GND.

One terminal of the switch SW1 receives the power supply voltage $V_{DD}$, and the other terminal is connected to one terminal of the switch SW2. The other terminal of the switch SW2 is grounded. One terminal of the wire capacitor C1 and the one terminal of the switch 2 are connected to a node placed between the switch SW1 and the switch SW2. The other terminal of the switch 2 is connected to one terminal of the wire capacitor C2. The other terminals of the wire capacitor C1 and capacitor C2 are grounded.

FIG. 2 schematically illustrates a state of the semiconductor integrated circuit 1 in a case in which the signal $V_{IN}$ is at 1. The switch SW1 is turned on and the switch SW2 and switch 2 are turned off. Charge is stored in the wire capacitor C1 by the power supply voltage $V_{DD}$.

FIG. 3 schematically illustrates a state of the semiconductor integrated circuit 1 in a case immediately after the signal $V_{IN}$ has changed from 1 to 0. The switches SW1 and SW2 are turned off and the switch 2 is turned on. Part of the charge stored in the wire capacitor C1 moves to the wire capacitor C2. The voltage of the wire L1 stabilizes when it becomes a certain value (referred to below as the voltage $V_{INT\_HIGH}$).

FIG. 4 schematically illustrates a state of the semiconductor integrated circuit 1 in case in which the signal $V_{IN}$ had changed to 0, after which the voltage of the wire L1 has stabilized. The switches SW1 and 2 are turned off and the switch SW2 is turned on. Charge stored in the wire capacitor C1 is released.

Figure 5:
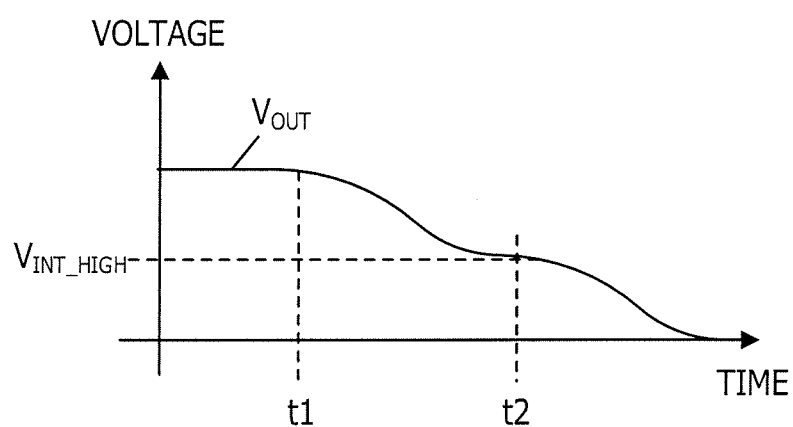
FIG. 5 illustrates an example of a voltage waveform of the wire L1 in a case in which a signal $V_{IN}$ changes from 1 to 0.

FIG. 5 illustrates an example of a voltage waveform of the wire L1 in a case in which the signal $V_{IN}$ changes from 1 to 0, with time on the horizontal axis and voltage on the vertical axis.

When the signal $V_{IN}$ changes from 1 to 0, the voltage $V_{OUT}$ of the wire L1 starts to drop, starting from time t1. At this time, the switch 2 is turned on under control of the charge recycling control circuit 3, shifting to the state illustrated in FIG. 3. At time t2 at which the voltage $V_{OUT}$ becomes the above-mentioned voltage $V_{INT\_HIGH}$, the switch 2 is turned off under control of the charge recycling control circuit 3, shifting to the state illustrated in FIG. 4, in which discharging occurs.

When the signal $V_{IN}$ changes from 1 to 0 as described above, part of the charge in the wire capacitor C1 is stored in the wire capacitor C2, reducing the amount of charge that are released when the wire capacitor C1 is discharged and thereby reducing power consumption.

When the signal $V_{IN}$ changes from 0 to 1, the semiconductor integrated circuit 1 changes from the state in FIG. 4 to the state in FIG. 3. Thus, part of the charge in the wire capacitor C2 moves to the wire capacitor C1, and the voltage of the wire L1 stabilizes when it becomes a certain value (referred to below as the voltage $V_{INT\_LOW}$).

Then, the semiconductor integrated circuit 1 enters the state in FIG. 2, storing the remaining charge in the wire capacitor C1.

Figure 6:
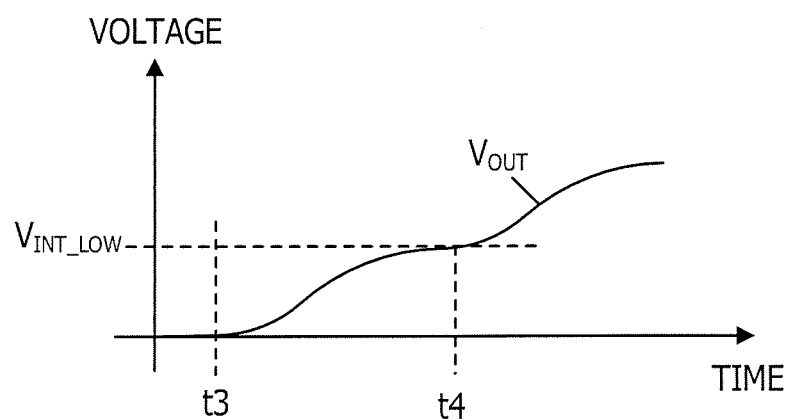
FIG. 6 illustrates an example of a voltage waveform of the wire L1 when the signal $V_{IN}$ changes from 0 to 1.

FIG. 6 illustrates an example of a voltage waveform of the wire L1 when the signal $V_{IN}$ changes from 0 to 1, with time on the horizontal axis and voltage on the vertical axis.

The voltage $V_{OUT}$ of the wire L1 starts to rise, starting from time t3. At this time, the switch 2 is turned on under control of the charge recycling control circuit 3, shifting to the state illustrated in FIG. 3. At time t4 at which the voltage $V_{OUT}$ becomes the above-mentioned voltage $V_{INT\_LOW}$, the switch 2 is turned off under control of the charge recycling control circuit 3, shifting to the state illustrated in FIG. 1, in which charging occurs.

When the signal $V_{IN}$ changes from 0 to 1 as described above, part of the charge in the wire capacitor C2 moves to the wire capacitor C1, reducing the amount of charge when the wire capacitor C1 is recharged and thereby reducing power consumption.

Equations (1) and (2) below hold due to relationships between voltages and charge in a state before the input changes and a state of charge movement between the wire capacitors C1 and C2 (a state in which charge is stored when the signal $V_{IN}$ changes from 1 to 0 or a state in which charge is reused when the signal $V_{IN}$ changes from 0 to 1).

$$C_L V_{DD} + C_R V_{INT\_LOW} = C_L V_{INT\_HIGH} + C_R V_{INT\_HIGH} \quad (1)$$

$$C_R V_{INT\_HIGH} = C_L V_{INT\_LOW} + C_R V_{INT\_LOW} \quad (2)$$

In equations (1) and (2), $C_L$ indicates the capacitance of the wire capacitor C1 and $C_R$ indicates the capacitance of the wire capacitor C2.

From equations (1) and (2), the voltage $V_{INT\_LOW}$ and voltage $V_{INT\_HIGH}$ may be respectively represented as in equations (3) and (4).

$$V_{INT\_LOW} = \frac{C_R}{C_L + 2C_R} V_{DD} \quad (3)$$

$$V_{INT\_HIGH} = \frac{C_L + C_R}{C_L + 2C_R} V_{DD} \quad (4)$$

Energy E consumed when charge are not reused is represented as in equation (5) below. Energy E consumed when charge is reused and the signal $V_{IN}$ changes from 1 to 0 is represented in equation (6) below. Energy E consumed when charge is reused and the signal $V_{IN}$ changes from 0 to 1 is represented as in equation (7) below.

Energy consumed when charge is reused $$E = \frac{1}{2} C_L V_{DD}^2 \quad (5)$$

Energy consumed when charge is reused and the signal $V_{IN}$ changes from 1 to 0

$$E = \frac{1}{2} C_L V_{INT\_HIGH}^2 \quad (6)$$

Energy consumed when charge is reused and the signal $V_{IN}$ changes from 0 to 1

$$E = \frac{1}{2} C_L (V_{DD} - V_{INT\_LOW})^2 \quad (7)$$

Since $V_{DD}$, $V_{INT\_HIGH}$, and $(V_{DD} - V_{INT\_LOW})$ are larger in that order, the semiconductor integrated circuit 1 in the first embodiment, which reuses charge, may reduce energy consumed when the value of the signal $V_{IN}$ changes as indicated in equations (6) and (7), suppressing power consumption.

Since, as illustrated in FIG. 1, the switch 2 is controlled by the charge recycling control circuit 3 to use the wire capacitor C2 of the free the wire L2, an extra capacitor is not used to reuse charge, making it possible to suppress power consumption with a circuit having a small area.

Second Embodiment

Figure 7:
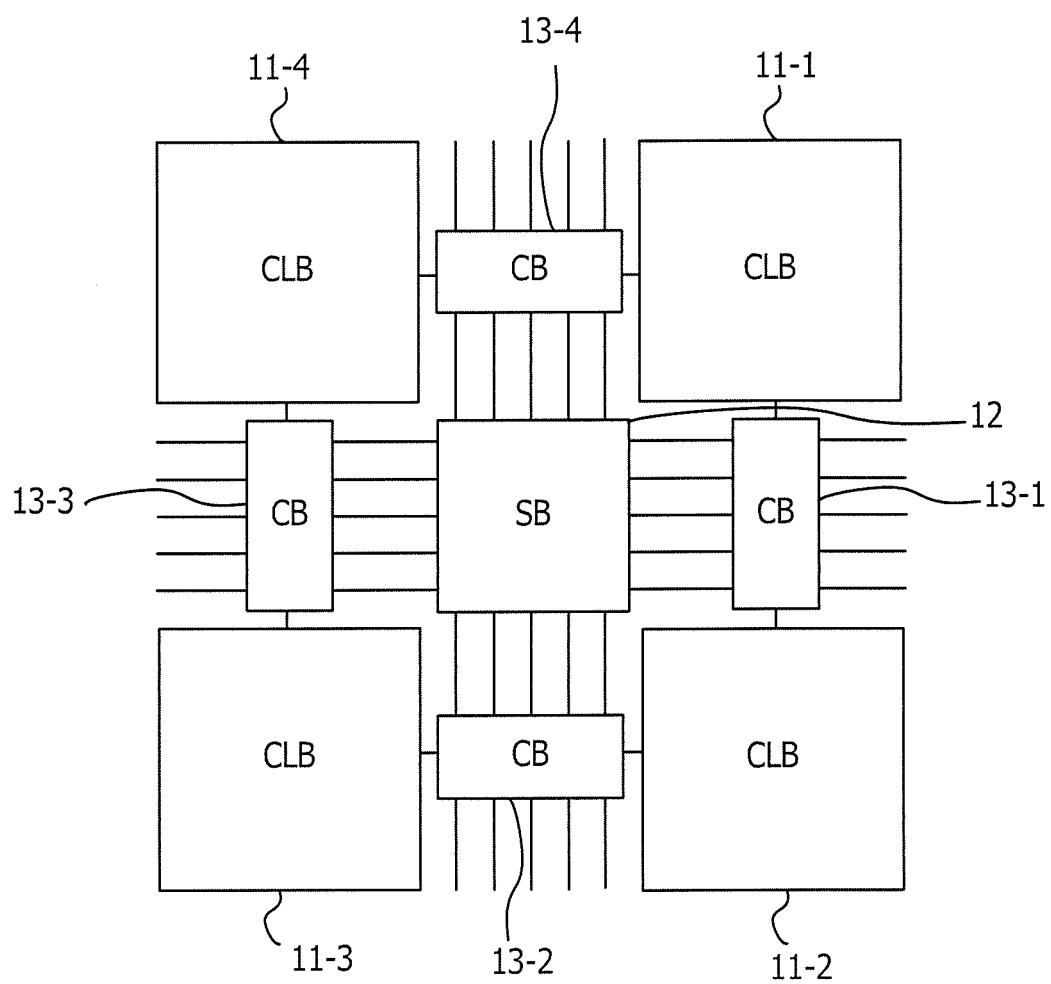
FIG. 7 illustrates an example of a semiconductor integrated circuit (FPGA) in a second embodiment.

FIG. 7 illustrates an example of a semiconductor integrated circuit (FPGA) in a second embodiment.

The semiconductor integrated circuit 10 includes CLBs 11-1, 11-2, 11-3, and 11-4, an SB 12, and CBs 13-1, 13-2, 13-3, and 13-4.

The CLBs 11-1, 11-2, 11-3, and 11-4 are each a logic circuit block having a plurality of basic logic elements. The SB 12 switches wires connected vertically and horizontally. The CBs 13-1 to 13-4 connect the CLBs 11-1 to 11-4 to the vertical or horizontal wires.

Example of Basic Logic Elements in the CLBs 11-1 to 11-4

Figure 8:
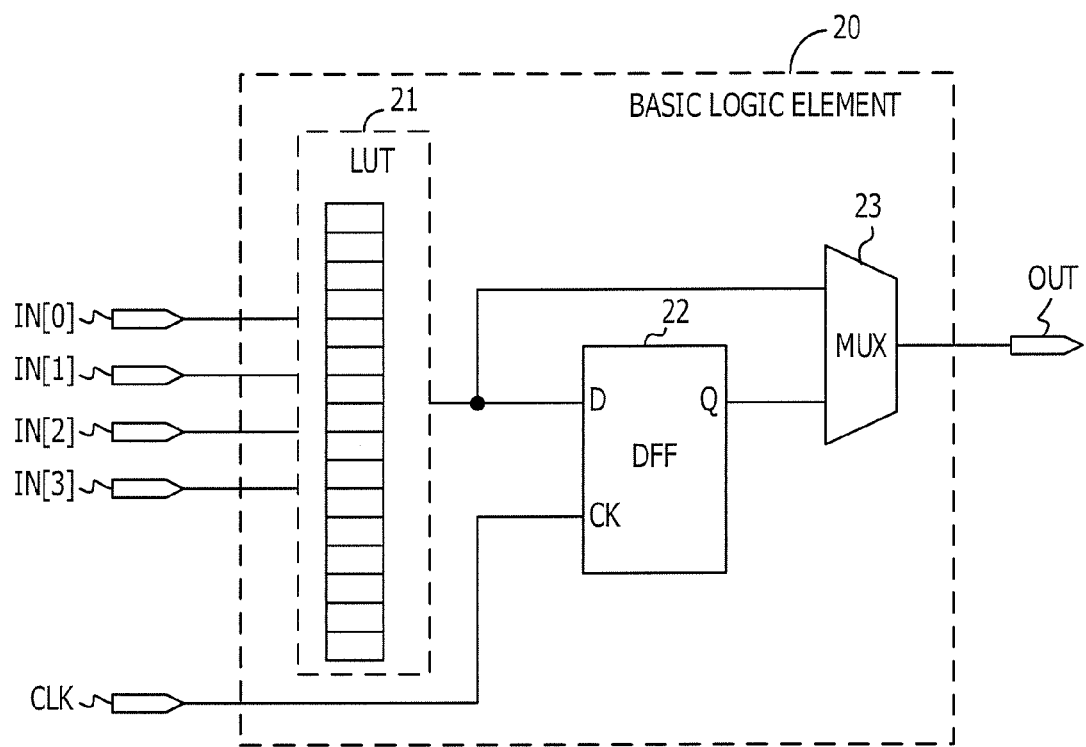
FIG. 8 illustrates an example of a basic logic element in a CLB.

FIG. 8 illustrates an example of a basic logic element in each CLB. A basic logic element 20 includes a lookup table (LUT) 21, a D-type flip-flop (DFF) 22, and a multiplexer (MUX) 23.

The LUT 21 is implemented by, for example, a static random access memory (SRAM). The LUT 21 accepts a four-bit address from its four input terminals IN [0], IN [1], IN [2], and IN [3] and outputs one-bit data stored therein according to the accepted address.

The DFF 22 receives a clock, which is input from a clock terminal CLK, at its clock terminal CK, fetches an output from the LUT 21 at a time synchronized with the clock, and outputs the fetched output from a terminal Q.

The MUX 23 selects one of outputs from the LUT 21 and DFF 22 and outputs the selected output from an output terminal OUT.

Example of the SB 12

Figure 9:
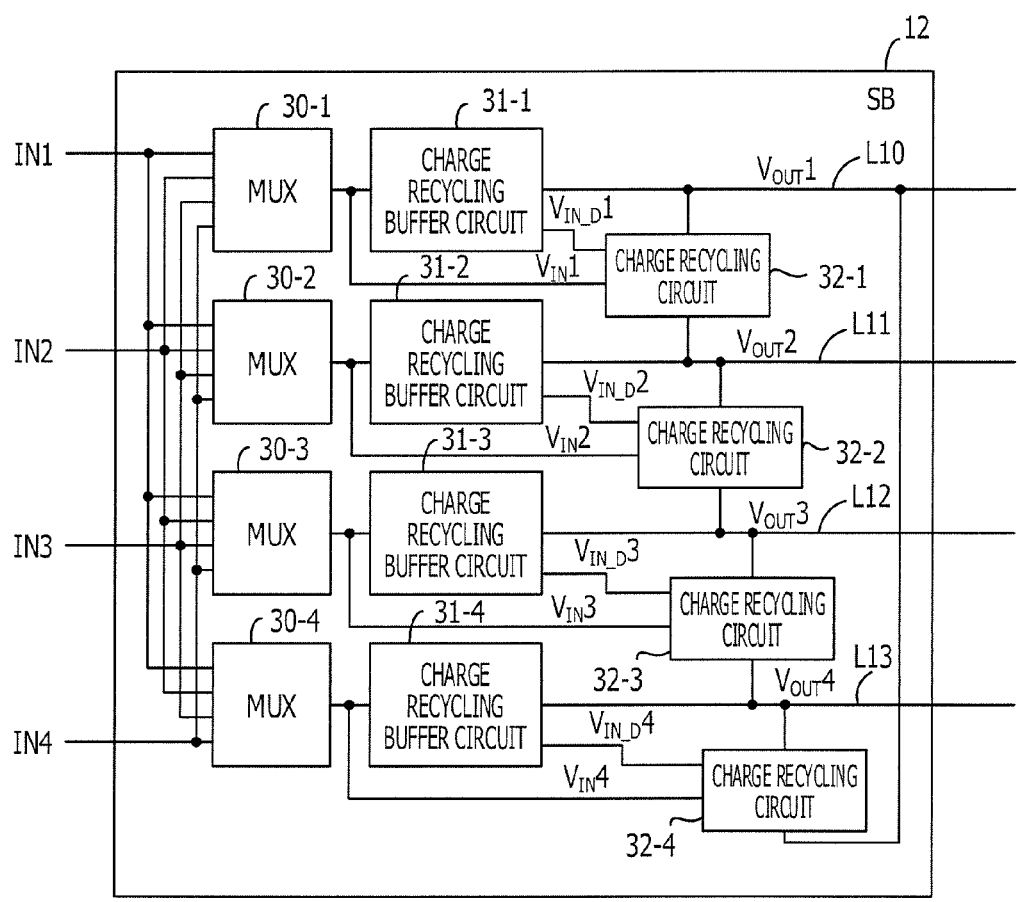
FIG. 9 illustrates an example of an SB.

FIG. 9 illustrates an example of an SB. The SB 12 in the semiconductor integrated circuit 10 in the second embodiment includes MUXes 30-1, 30-2, 30-3, and 30-4, charge recycling buffer circuits 31-1, 31-2, 31-3, and 31-4, and charge recycling circuits 32-1, 32-2, 32-3 and 32-4. At part of each wire in FIG. 9, an example of the name of a signal transmitted through the wire is indicated.

Each of the MUXes 30-1 to 30-4 selects any one of four input signals IN1, IN2, IN3, and IN4 and outputs the selected input signal as a signal $V_{IN}1$, $V_{IN}2$, $V_{IN}3$ or $V_{IN}4$. Control signals to the MUXes 30-1 to 30-4 are supplied from, for example, a configuration SRAM (not illustrated).

The charge recycling buffer circuits 31-1 to 31-4 have part of the functions of the charge recycling control circuit 3, illustrated in FIG. 1, described above. The charge recycling buffer circuits 31-1 to 31-4 respectively retain the signals $V_{IN}1$ to $V_{IN}4$ and output them to wires L10, L11, L12, and L13 as signals $V_{OUT}1$, $V_{OUT}2$, $V_{OUT}3$, and $V_{OUT}4$. The charge recycling buffer circuits 31-1 to 31-4 respectively create signals $V_{IN\_D}1$, $V_{IN\_D}2$, $V_{IN\_D}3$, and $V_{IN\_D}4$ from the signals $V_{IN}1$ to $V_{IN}4$ and supply them to the charge recycling circuits 32-1 to 32-4, which have the function of the switch 2 illustrated in FIG. 1. The signals $V_{IN\_D}1$ to $V_{IN\_D}4$ determine periods of a charge recovery operation and a charge recycling operation (periods during which the switch 2 is turned on in the state illustrated in FIG. 3).

The charge recycling circuits 32-1 to 32-4 have the function of the switch 2 in FIG. 1 and also have part of the functions of the charge recycling control circuit 3. Specifically, the charge recycling circuit 32-1 creates or breaks an electric connection between the wire L10 and the wire L11 according to the signals $V_{IN}1$ and $V_{IN\_D}1$, the charge recycling circuit 32-2 creates or breaks an electric connection between the wire L11 and the wire L12 according to the signals $V_{IN}2$ and $V_{IN\_D}2$, the charge recycling circuit 32-3 creates or breaks an electric connection between the wire L12 and the wire L13 according to the signals $V_{IN}3$ and $V_{IN\_D}3$, and the charge recycling circuit 32-4 creates or breaks an electric connection between the wire L13 and the wire L10 according to the signals $V_{IN}4$ and $V_{IN\_D}4$.

In an example of the SB 12 in FIG. 9, a single free wire is used to store charge in correspondence to a single wire through which a signal is transmitted; a wire used to store charge in correspondence to a certain wire is not changed. If, for example, the wires L11 and L13 of the wires L10 to L13 are free wires, through which no signal is transmitted, the wire L11 is used to store charge of the wire L10 and the wire L13 is used to store charge of the wire L12.

Although, in the above example, adjacent wires are used to store charge, this is not a limitation. If, for example, the charge recycling circuit 32-1 is connected between the wires L10 and L12, the wire L12 is used to store charge of the wire L10. It is also possible to reuse charge among the wires of a plurality of dies by using a three-dimensional mounting technology.

An example of the charge recycling buffer circuits 31-1 to 31-4 of the SB 12 will be described below.

Example of the Charge Recycling Buffer Circuits 31-1 to 31-4

Figure 10:
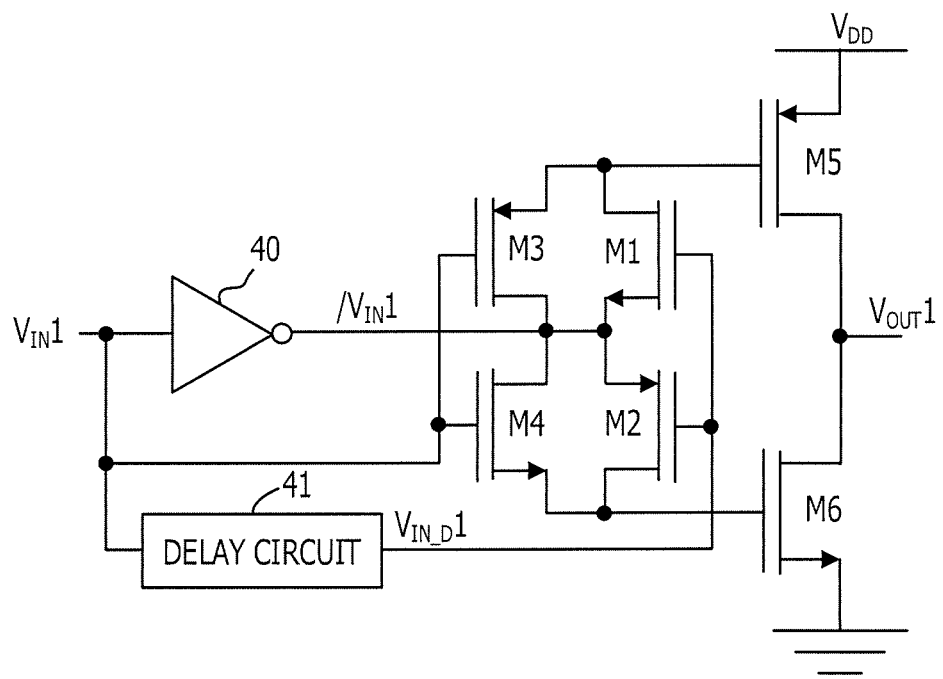
FIG. 10 illustrates an example of a charge recycling buffer circuit.

FIG. 10 illustrates an example of a charge recycling buffer circuit. Although an example of only the charge recycling buffer circuit 31-1 in FIG. 9 will be taken in the description below, the other charge recycling buffer circuits 31-2, 31-3, and 31-4 may also be implemented in the same way.

The charge recycling buffer circuit 31-1 has an inverter circuit 40, a delay circuit 41, and transistors M1, M2, M3, M4, M5, and M6.

The inverter circuit 40 receives the signal $V_{IN}1$ and outputs a signal $/V_{IN}1$, which is created by inverting the logic level of the signal $V_{IN}1$. The delay circuit 41 receives the signal $V_{IN}1$ and outputs a signal $V_{IN\_D}1$, which is created by delaying the signal $V_{IN}1$.

Of the transistors M1 to M6, the transistors M1, M4, and M6 are n-channel metal-oxide semiconductor field effect transistors (MOSFETs) and the transistors M2, M3, and M5 are p-channel MOSFETs.

The transistors M5 and M6 function as an inverter circuit. The transistors M1 to M4 function as a gating circuit that controls the inverter circuit.

The gates of the transistors M1 and M2 receive the signal $V_{IN\_D}1$ output from the delay circuit 41, and the gates of the transistors M3 and M4 receive the signal $V_{IN}1$. The sources of the transistors M1 and M2 and the drains of the transistors M3 and M4 receive the signal $/V_{IN}1$ output from the inverter circuit 40. The drain of the transistor M1 and the source of the transistor M3 are connected to the gate of the transistor M5. The drain of the transistor M2 and the source of the transistor M4 are connected to the gate of the transistor M6.

In the transistors M5 and M6, which function as an inverter circuit, the power supply voltage $V_{DD}$ is applied to the source of the transistor M5 and its drain is connected to the drain of the transistor M6. The source of the transistor M6 is grounded. The potential of a node placed between the drain of the transistor M5 and the drain of the transistor M6 is output as a voltage $V_{OUT}1$.

In a state in which charge is stored (referred to blow as the charge recovery state) and a state in which charge is reused (referred to below as the charge recycling state), the gating circuit formed with the transistors M1 to M4 controls the wire L10 in combination with the delay circuit 41 so that the wire L10 is disconnected from the power supply and GND by turning off the transistors M5 and M6 while charge move.

Next, an example of the delay circuit 41 of the charge recycling buffer circuit 31-1 will be described.

Example of the Delay Circuit 41

Figure 11:
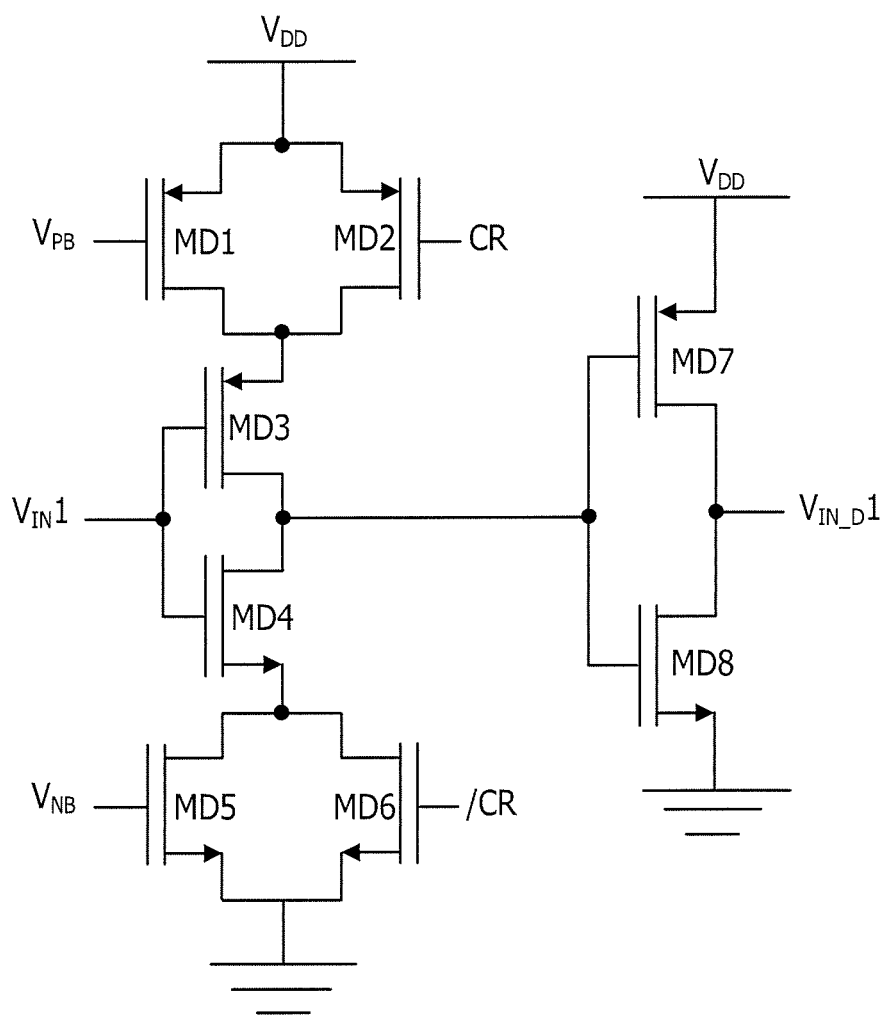
FIG. 11 illustrates an example of a delay circuit.

FIG. 11 illustrates an example of a delay circuit. The delay circuit 41 has a function that delays the signal $V_{IN}1$ by an amount equal to a time during which charge move in the charge recovery state and charge recycling state. In the example of the delay circuit 41 in FIG. 11, a current-starved inverter is used.

The delay circuit 41 has transistors MD1, MD2, MD3, MD4, MD5, MD6, MD7, and MD8. Of the transistors MD1 to MD8, the transistors MD1, MD2, MD3, and MD7 are each a p-channel MOSFET and the transistors MD4, MD5, MD6, and MD8 each are an n-channel MOSFET.

A bias voltage $V_{PB}$ is applied to the gate of the transistor MD1. A signal CR is input to the gate of the transistor MD2. The power supply voltage $V_{DD}$ is applied to the sources of the transistors MD1 and MD2. The drains of the transistors MD1 and MD2 are connected to the source of the transistor MD3. The drain of the transistor MD3 is connected to the drain of the transistor MD4 and to the gates of the transistors MD7 and MD8. The signal $V_{IN}1$ is input to the gates of the transistors MD3 and MD4. The source of the transistor MD4 is connected to the drains of the transistors MD5 and MD6. A bias voltage $V_{NB}$ is applied to the gate of the transistor MD5. A signal /CR, which is created by inverting the logic level of the signal CR, is input to the gate of the transistor MD2. The sources of the transistors MD5 and MD6 are grounded.

The transistors MD7 and MD8 function as an inverter circuit; the power supply voltage $V_{DD}$ is applied to the source of the transistor MD7 and its drain is connected to the drain of the transistor MD8. The source of the transistor MD8 is grounded. The potential of a node placed between the drain of the transistor MD7 and the drain of the transistor MD8 is output as the signal $V_{IN\_D}1$.

This delay circuit 41 may adjust a delay by adjusting the value of a clamp current, so the delay circuit 41 may adjust a delay time so as to make a match with the time described above during which charge move. The delay time is preferably a time from when the falling edge of the signal $V_{IN}1$ starts to change until the signal $V_{OUT}1$ reaches the voltage $V_{INT\_HIGH}$ and a time from when the rising edge of the signal $V_{IN}1$ starts to change until the signal $V_{OUT}1$ reaches the voltage $V_{INT\_LOW}$. To meet a timing restriction, therefore, it is preferable to determine these times in advance through a simulation so that the delay time is shortened as much as possible. Even if a delay time shorter than a time taken by the signal $V_{OUT}1$ to reach the voltage $V_{INT\_HIGH}$ or $V_{INT\_LOW}$ is set, only less electric power is reduced and logical operation itself is not affected.

In the delay circuit 41, whether to introduce a delay may be set by using the signal CR. When the value of the signal CR used to enable the reuse of charge is set to 1, the transistors MD2 and MD6 are turned off. At this time, the transistors MD1 and MD5 function as a clamp current source. The bias voltage $V_{PB}$ applied to the gate of the transistor MD1 limits the current flowing in the transistor MD1 and the bias voltage $V_{NB}$ applied to the gate of the transistor MD5 limits the current flowing in the transistor MD5. Thus, a delay is generated.

While the signal CR is 0, the transistors MD2 and MD6 are turned on, suppressing a delay from being generated by the clamp current source, which would otherwise be implemented by the transistors MD1 and MD5. As a result, an operation to reuse charge is not performed.

As described above, the delay circuit 41 enables or disables the delay function depending on the value of the setting signal (signal CR), so the delay circuit 41 may selectively set whether to enable or disable the reuse of charge.

If, for example, a signal with a high operation ratio is transmitted through a wire, the wire consumes much power, so the reuse of charge is enabled to reduce the power consumption of the wire. If a signal that does not meet a timing restriction if a long delay is caused is transmitted through a wire, the reuse of charge is disabled.

The signal CR is output from, for example, a configuration SRAM cell (not illustrated). The configuration SRAM cell is set according to, for example, a setting that enables or disables the reuse of charge (see FIG. 25), the setting being obtained by a design method described later.

The bias voltages $V_{PB}$ and $V_{NB}$, which are obtained, for example, outside the semiconductor integrated circuit 10 in consideration of the above delay time, may be respectively applied to the gates of the transistors MD1 and MD5 through special power supply pins. Alternatively, the bias voltages $V_{PB}$ and $V_{NB}$ may be generated from a power supply included in the semiconductor integrated circuit 10.

Example of the Charge Recycling Circuit 32-1

Figure 12:
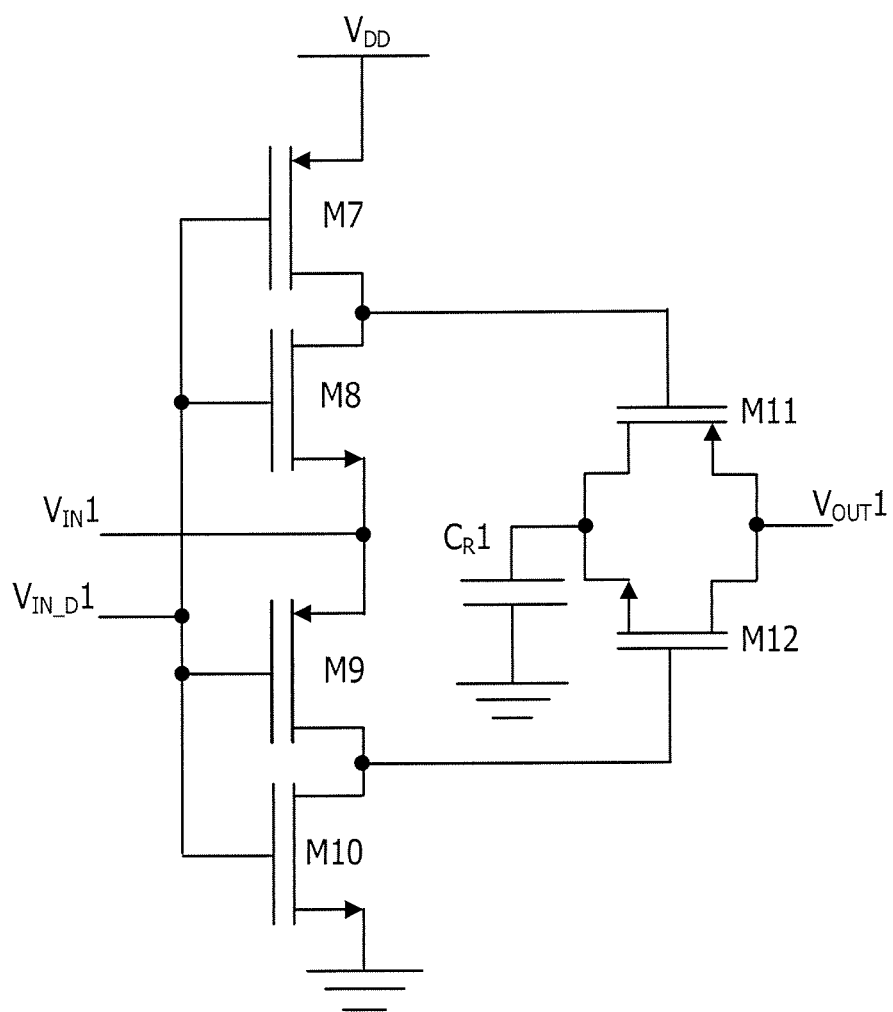
FIG. 12 illustrates an example of a charge recycling circuit.

FIG. 12 illustrates an example of a charge recycling circuit. Although an example of only the charge recycling circuit 32-1 in FIG. 9 will be taken in the description below, the other charge recycling circuits 32-2 to 32-4 may also be implemented in the same way.

In the charge recovery state and charge recycling state, the charge recycling circuit 32-1 a function used a switch that mutually connect the wires L10 and L11.

The charge recycling circuit 32-1 has transistors M7, M8, M9, M10, M11, and M12. Of the transistors M7 to M12, the transistors M7, M9, and M11 are p-channel MOSFETs and the transistors M8, M10, and M12 are n-channel MOSFETs.

The gates of the transistors M7 and M10 receive the signal $V_{IN\_D}1$ output from the delay circuit 41 described above. The power supply voltage $V_{DD}$ is applied to the source of the transistor M7. The drain of the transistor M7 is connected to the drain of the transistor M8 and the gate of the transistor M11. The source of the transistor M8 and the source of the transistor M9 are mutually connected; the signal $V_{IN}1$ is input to these sources. The drain of the transistor M9 is connected to the drain of the transistor M10 and the gate of the transistor M12. The source of the transistor M10 is grounded.

The transistors M11 and M12 each function as a pass transistor. A capacitor $C_R1$ is connected to the drain of the transistor M11 and the source of the transistor M12. The capacitor $C_R1$ is a wire capacitor of the wire L11. The signal $V_{OUT}1$, which is transmitted through the wire L10, is input to the source of the transistor M11 and the drain of the transistor M12. These pass transistors M11 and M12 function as the switch 2 in FIG. 1, and the transistors M7 to M10 function as part of the charge recycling control circuit 3 in FIG. 1.

An example of the operation of the semiconductor integrated circuit 10 in the second embodiment will be described below.

Example of the Operation of the Semiconductor Integrated Circuit 10

Figure 13:
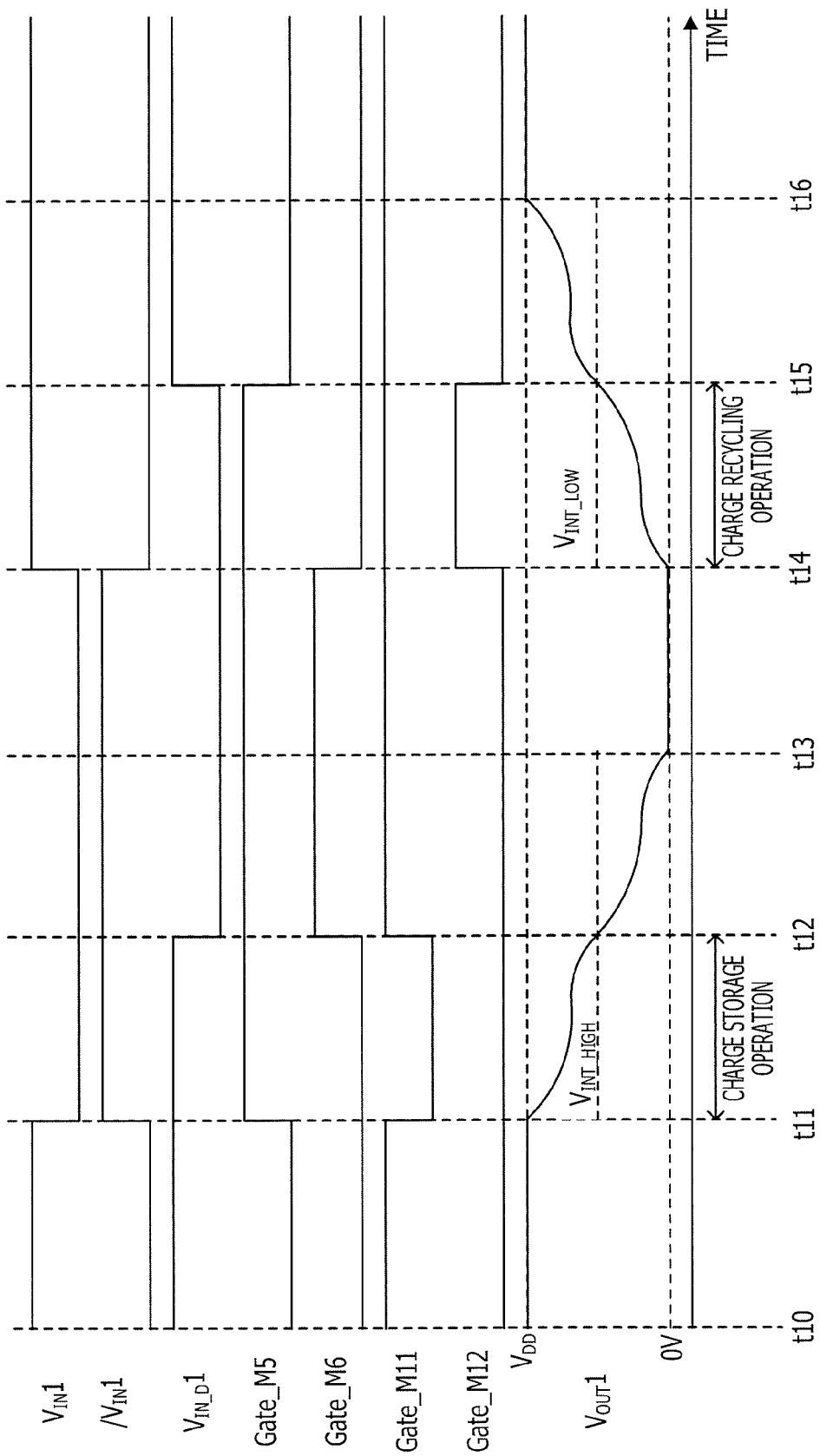
FIG. 13 is a timing diagram illustrating an example of the operation of the semiconductor integrated circuit in the second embodiment.

FIG. 13 is a timing diagram illustrating an example of the operation of the semiconductor integrated circuit in the second embodiment.

The operations of the charge recycling buffer circuit 31-1 and charge recycling circuit 32-1 will be mainly described below, assuming that a signal is transmitted through the wire L10 in FIG. 12 and the wire L11 in the drawing is a free wire, through which no signal is transmitted. It is also assumed that the signal CR described above, which is input to the delay circuit 41, has been set to 1, enabling the reuse of charge.

In FIG. 13, the states of the signals $V_{IN}1$, $/V_{IN}1$, $V_{IN\_D}1$, and $V_{OUT}1$ described above are indicated. The states of gates voltages Gate_M5 and Gate_M6 of the transistors M5 and M6 in the charge recycling buffer circuit 31-1 and gates voltages Gate_M11 and Gate_M12 of the transistors M11 and M12 in the charge recycling circuit 32-1 are also indicated.

In the charge recycling buffer circuit 31-1 in FIG. 10, when the signal $V_{IN}1$ and $V_{IN\_D}1$ are high at time t10, the transistors M1 and M4 are turned on and the transistors M2 and M3 are turned off. Since the signal $/V_{IN}1$ is low at this time, the gate voltages Gate_M5 and Gate_M6 of the transistors M5 and M6 are low, so the transistor M5 is turned on and the transistor M6 are turned off. Therefore, the signal $V_{OUT}1$ is high.

In the charge recycling circuit 32-1, when the signal $V_{IN}1$ and $V_{IN\_D}1$ are high, the transistors M7 and M9 are turned off and the transistors M8 and M10 are turned on. Therefore, the gate voltage Gate_M11 is high and the gate voltage Gate_M12 is low, so both the transistors M11 and M12 are turned off, breaking the electric connection between the wires L10 and L11.

When the signal $V_{IN}1$ goes low at time t11, the signal $V_{IN\_D}1$ in the charge recycling buffer circuit 31-1 remains high due to a delay time introduced by the delay circuit 41, so the transistor M1 is left turned on and the transistor M2 is left turned off. By contrast, the transistor M3 is turned on and the transistor M4 is turned off. At this time, the signal $/V_{IN}1$ is high, so the gate voltage Gate_M5 of the transistor M5 becomes high and the transistor M5 is turned off. However, the gate voltage Gate_M6 of the transistor M6 remains low, so the transistor M6 is left turned off.

Thus, the wire L10 is disconnected from the power supply and GND.

In the charge recycling circuit 32-1, the signal $V_{IN\_D}1$ remains high at time t11, so the states of the transistors M7 to M10 are the same as at time t10. Since the signal $V_{IN}1$ goes low, however, the gate voltage Gate_M11 goes low, turning on the transistor M11. Thus, the wires L10 and L11 are mutually connected electrically, so part of charge in the wire capacitor of the wire L10 is stored in the wire capacitor, with a capacitance of $C_R1$, of the wire L11 through the transistor M11. This movement of charge causes the potential of the signal $V_{OUT}1$ to start to drop.

When the signal $V_{IN\_D}1$ goes low at time t12 at which the voltage $V_{OUT}1$ reaches the voltage $V_{INT\_HIGH}$ (at which charge movement and charge recovery are terminated), in the charge recycling buffer circuit 31-1, the transistor M1 is turned off and the transistor M2 is turned on. Thus, the gate voltage Gate_M6 goes high and the transistor M6 is turned on. Since the wire L10 is thereby grounded (connected to the GND), charge remaining in the wire capacitor of the wire L10 are released, further lowering the potential of the signal $V_{OUT}1$. Discharging is completed at time t13.

When the signal $V_{IN\_D}1$ goes low at time t12, in the charge recycling circuit 32-1, the transistors M7 and M9 are turned on and the transistors M8 and M10 are turned off. Thus, the gate voltage Gate_M11 goes high and the transistor M11 is turned off. Thus, the electric connection between the wire L10 and the wire L11 is broken.

Then, when the signal $V_{IN}1$ goes high at time t14, since the signal $V_{IN\_D}1$ remains low in the charge recycling buffer circuit 31-1, the transistor M1 is left turned off and the transistor M2 is left turned on. However, the transistor M3 is turned off and the transistor M4 is turned on. Since the signal $/V_{IN}1$ is low at this time, the gate voltage Gate_M5 of the transistor M5 remains high and the transistor M5 is left turned off. However, the gate voltage Gate_M6 of the transistor M6 goes low and the transistor M6 is turned off.

Thus, the wire L10 is disconnected from the power supply and GND.

In the charge recycling circuit 32-1, the signal $V_{IN\_D}1$ remains low at time t14, so the states of the transistors M7 to M10 are the same as at time t12. Since the signal $V_{IN}1$ goes high, however, the gate voltage Gate_M12 goes high, turning on the transistor M12. Thus, the wires L10 and L11 are mutually connected electrically, so part of charge in the wire capacitor, with a capacitance of $C_R1$, of the wire L11 starts to be stored in the wire capacitor of the wire L10 through the transistor M12, starting the charge recycling operation. This movement of charge causes the potential of the signal $V_{OUT}1$ to start to rise.

When the signal $V_{IN\_D}1$ goes high at time t15 at which the voltage $V_{OUT}1$ reaches the voltage $V_{INT\_LOW}$, in the charge recycling buffer circuit 31-1, the transistor M1 is turned on and the transistor M2 is turned off. Thus, the gate voltage Gate_M5 goes low and the transistor M5 is turned on. Since the power supply voltage $V_{DD}$ is thereby applied to the wire L10, the wire capacitor of the wire L10 is further charged, further raising the potential of the signal $V_{OUT}1$. Charging is completed at time t16.

When the signal $V_{IN\_D}1$ goes low at time t15, in the charge recycling circuit 32-1, the transistors M7 and M9 are turned off and the transistors M8 and M10 are turned on. Thus, the gate voltage Gate_M12 goes low and the transistor M12 is turned off. Thus, the electric connection between the wire L10 and the wire L11 is broken.

When the signal $V_{IN}1$ changes from high to low (from 1 to 0) as illustrated in FIG. 13, part of the charge in the wire capacitor of the wire L10 is stored in the wire capacitor of the wire L11, which is a free wire, during a period from time t11 to time t12. Therefore, a voltage change during discharging from the wire L10 causes a change from the voltage $V_{INT\_HIGH}$ to 0 V, reducing power consumption.

When the signal $V_{IN}1$ changes from low to high (from 0 to 1), part of the charge in the wire capacitor of the wire L11 is stored in the wire capacitor of the wire L10 during a period from time t14 to time t15. Therefore, a voltage change during charging of the wire L10 causes a change from the voltage $V_{INT\_LOW}$ to the power supply voltage $V_{DD}$, reducing power consumption.

If, for example, the wires L10 and L11 have the same length, $C_L$ and $C_R$ in equations (3) and (4) above become equal.

Therefore, equations (3) and (4) may be respectively rewritten as equations (8) and (9).

$$V_{INT\_LOW} = \frac{1}{3} V_{DD} \quad (8)$$

$$V_{INT\_HIGH} = \frac{2}{3} V_{DD} \quad (9)$$

Power consumption may be represented as in equations (6) and (7), so it becomes $2C_L V_{DD}^2/9$ both when the signal $V_{IN}1$ changes from 1 to 0 and when the signal $V_{IN}1$ changes from 0 to 1. If charge is not reused (the voltage during discharging or charging changes from 0 V to the power supply voltage $V_{DD}$), power consumption is represented as $C_L V_{DD}^2/2$, so the effect of reducing electric power due to the reuse of charge is about 4/9 (56%).

In the semiconductor integrated circuit 10 in the second embodiment, the wire capacitor of a free wire (the wire L11 in the above example) is used to reuse charge, so power consumption may be suppressed with a circuit having a small area.

Although a case in which a wire used to store charge remains unchanged as illustrated in FIG. 9 has been described above, this is not a limitation; a wire used to store charge may be changed or a plurality of free wires may be used to store charge of a single wire. An example of another SB will be described below.

Example of Another SB

Figure 14:
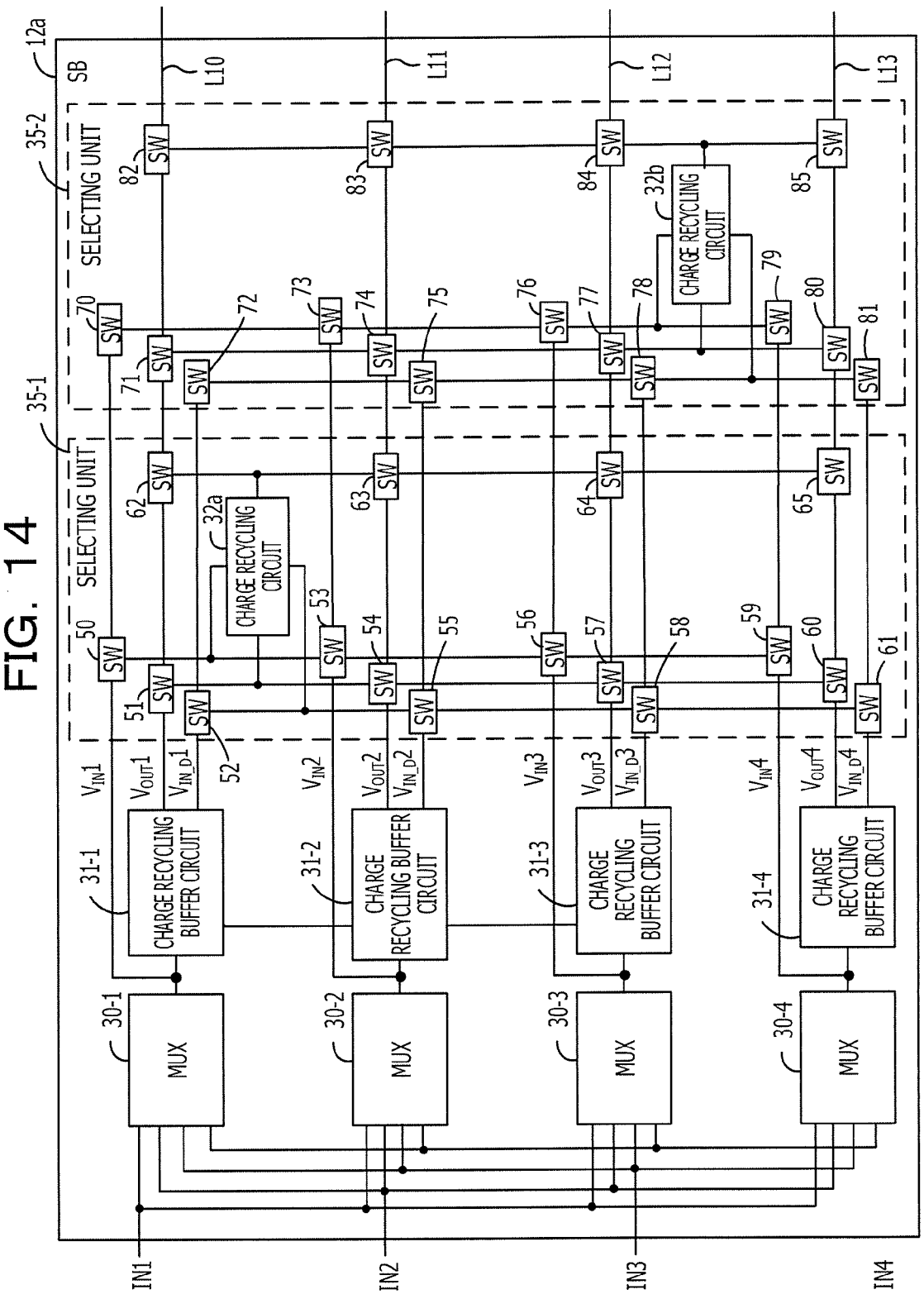
FIG. 14 illustrates an example of another SB.

FIG. 14 illustrates an example of another SB. Elements that are the same as in the SB 12 in FIG. 9 will be given the same reference numerals.

An SB 12a includes a selecting unit 35-1 that selects a wire that uses a charge recycling circuit 32a and also has a selecting unit 35-2 that selects a wire that uses a charge recycling circuit 32b. The SB 12a may use the charge recycling circuits 32a and 32b in any combination of wires. The charge recycling circuits 32a and 32b are similar to the charge recycling circuit 32-1 in FIG. 12.

The selecting unit 35-1 includes switches (SWs) 50, 51, 52, 53, 54, 55, 56, 57, 58, 59, 60, 61, 62, 63, 64, and 65.

The switches 50 to 61 each select a signal to be input to the charge recycling circuit 32a from the signals $V_{IN}1$ to $V_{IN}4$, $V_{IN\_D}1$ to $V_{IN\_D}4$, and $V_{OUT}1$ to $V_{OUT}4$. The switches 62 to 65 each select a wire to be used as a free wire to store charge from the wires L10 to L13.

The selecting unit 35-2 includes witches 70, 71, 72, 73, 74, 75, 76, 77, 78, 79, 80, 81, 82, 83, 84, and 85.

The switches 70 to 81 each select a signal to be input to the charge recycling circuit 32b from the signals $V_{IN}1$ to $V_{IN}4$, $V_{IN\_D}1$ to $V_{IN\_D}4$, and $V_{OUT}1$ to $V_{OUT}4$. The switches 82 to 85 each select a wire to be used as a free wire to store charge from the wires L10 to L13.

The switches 50 to 65 and 70 to 85 are controlled so as to be turned on and off according to a setting stored in, for example, a configuration SRAM (not illustrated).

Figure 15:
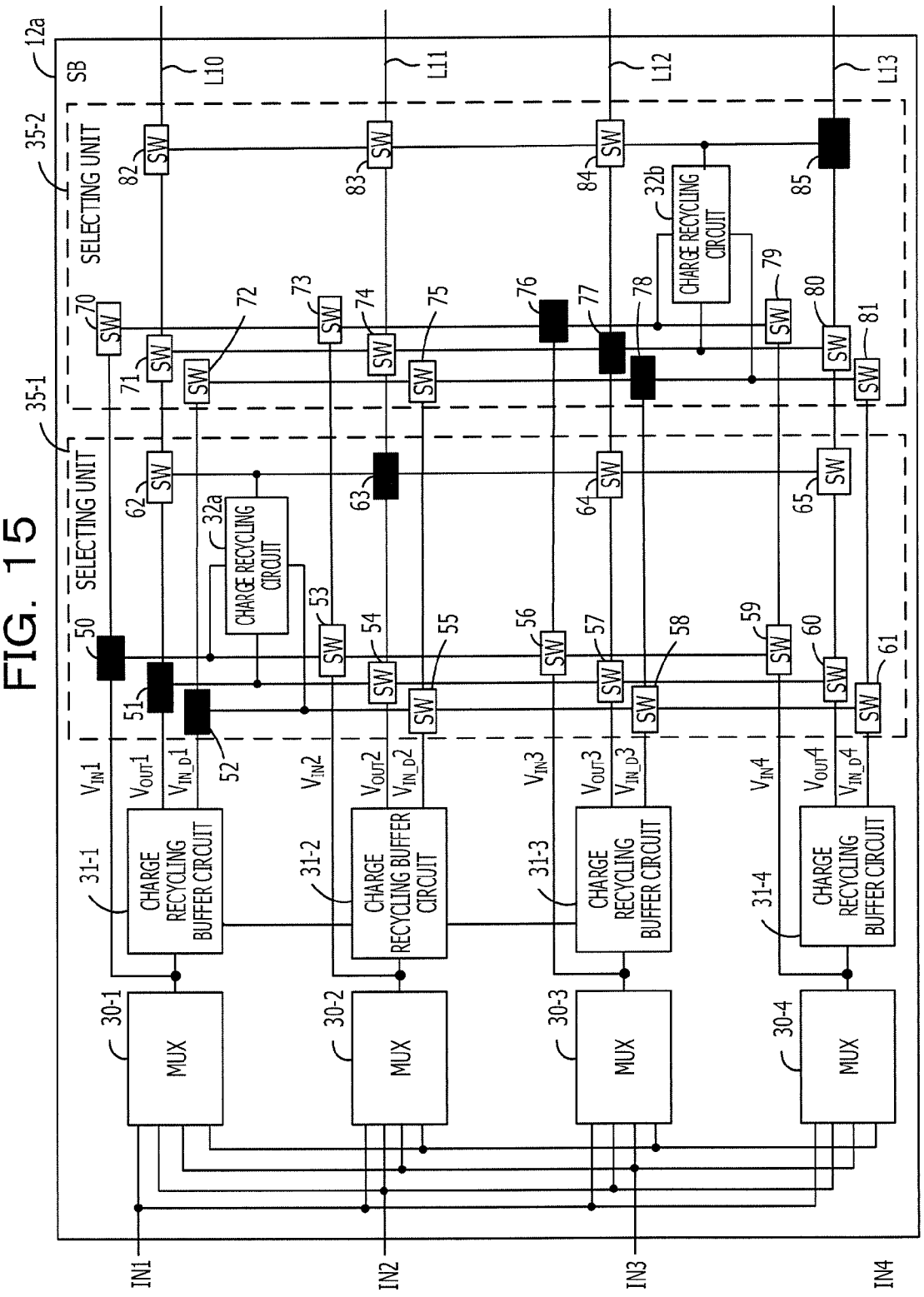
FIG. 15 illustrates an example of placement of switches when an arbitrary free wire is used.

FIG. 15 illustrates an example of placement of switches when an arbitrary free wire is used.

In FIG. 15, an example of placement of the switches 50 to 65 and 70 to 85 is illustrated in a case in which signals are transmitted through the wires L10 and L12 and the wires L11 and L13 are free wires. The switches 50 to 52, 63, 76 to 78, and 85, which are indicated by solid black boxes, mutually connect vertical and horizontal wires.

In this placement, when the signal $V_{IN}1$ changes from 1 to 0, part of the charge in the wire capacitor of the wire L10 is stored in the wire capacitor of the wire L11 through the switch 51, charge recycling circuit 32a, and switch 63. At this time, the signal $V_{OUT}1$ drops to $V_{INT\_HIGH}$ and then drops to 0 V due to discharging, as illustrated in FIG. 13. Thus, power consumption during discharging is reduced as described above.

When the signal $V_{IN}1$ changes from 0 to 1, part of the charge in the wire capacitor of the wire L11 is stored in the wire capacitor of the wire L10 through the switch 63, charge recycling circuit 32a, and switch 51. At this time, the signal $V_{OUT}1$ is raised to $V_{INT\_LOW}$ and is then raised to the power supply voltage $V_{DD}$ because the remaining charge is stored in the wire capacitance of the wire L10, as illustrated in FIG. 13. Thus, power consumption during charging is reduced as described above.

When the signal $V_{IN}3$ changes from 1 to 0, part of charge in the wire capacitor of the wire L12 is stored in the wire capacitor of the wire L13 through the switch 77, charge recycling circuit 32b, and switch 85. At this time, the signal $V_{OUT}3$ drops to $V_{INT\_HIGH}$ as with the $V_{OUT}1$ illustrated in FIG. 13 and then drops to 0 V due to discharging. Thus, power consumption during discharging is reduced as described above.

When the signal $V_{IN}3$ changes from 0 to 1, part of the charge in the wire capacitor of the wire L13 is stored in the wire capacitor of the wire L10 through the switch 85, charge recycling circuit 32b, and switch 77. At this time, the signal $V_{OUT}3$ is raised to $V_{INT\_LOW}$ and is then raised to the power supply voltage $V_{DD}$ because the remaining charge is stored in the wire capacitance of the wire L12, as illustrated in FIG. 13. Thus, power consumption during charging is reduced as described above.

Figure 16:
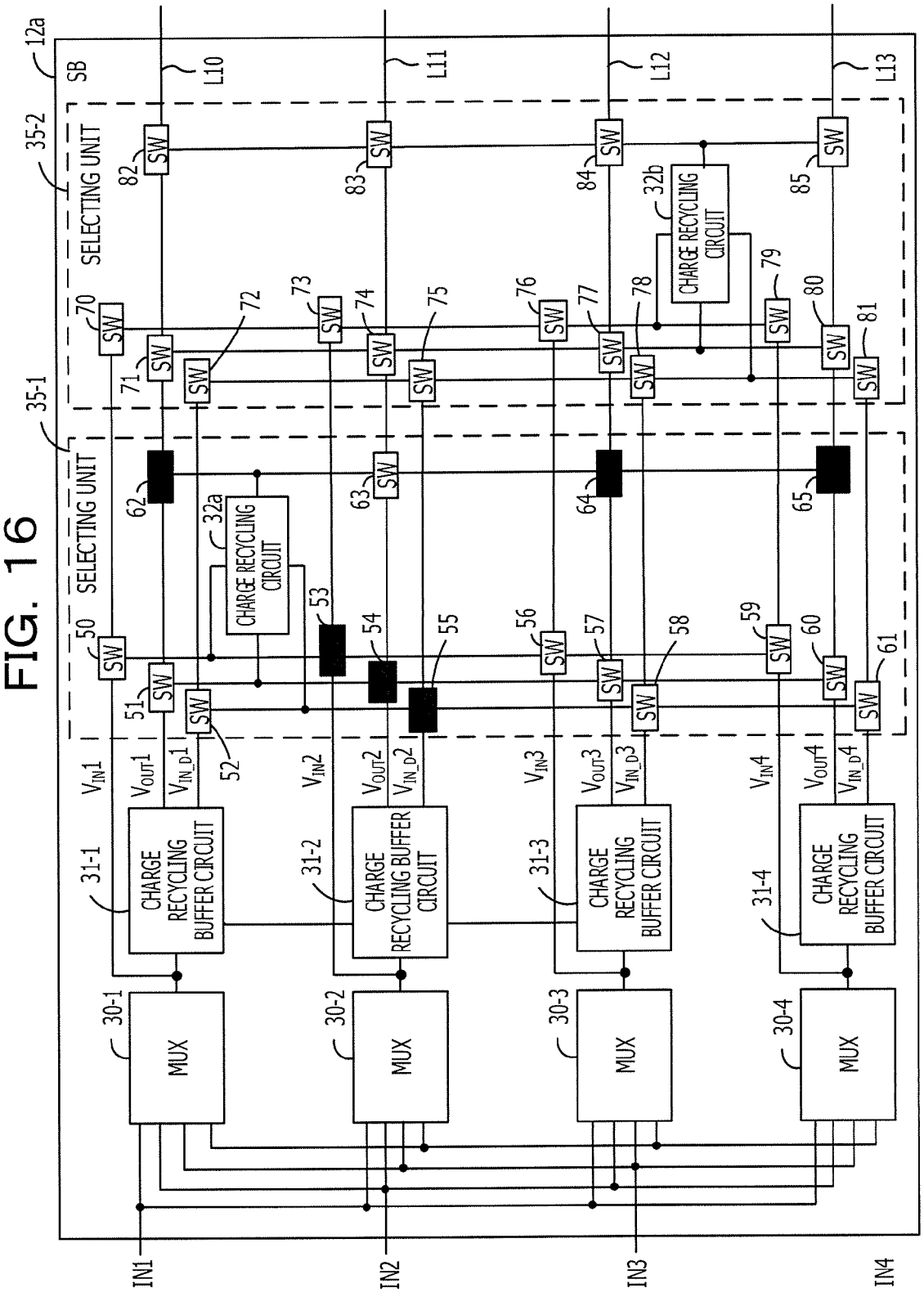
FIG. 16 illustrates an example of placement of switches when a plurality of free wires is used to store charge present in a single wire.

FIG. 16 illustrates an example of placement of switches when a plurality of free wires is used to store charge present in a single wire.

In FIG. 16, an example of placement of the switches 50 to 65 and 70 to 85 is illustrated in a case in which a signal is transmitted through the wire L11 and the other wires L10, L12, and L13 are free wires. The switches 53 to 55, 62, 64, and 65, which are indicated by solid black boxes, mutually connect vertical and horizontal wires.

In this placement, when the signal $V_{IN}2$ changes from 1 to 0, part of the charge in the wire capacitor of the wire L11 is stored in the wire capacitors of the wires L10, L12, and L13 through the switch 54, charge recycling circuit 32a, and switches 62, 64, and 65.

At this time, the signal $V_{OUT}2$ drops to $V_{INT\_HIGH}$ and then drops to 0 V due to discharging.

When the signal $V_{IN}2$ changes from 0 to 1, part of the charge in the wire capacitors of the wires L10, L12, and L13 is stored in the wire capacitor of the wire L11 through the switches 62, 64, and 65, charge recycling circuit 32a, and switch 54.

At this time, the signal $V_{OUT}2$ drops to $V_{INT\_LOW}$ and then drops to the power supply voltage $V_{DD}$ because the remaining charge is stored in the wire capacitance of the wire L11.

When a plurality of free wires are used to store charge present in a single wire, the capacitance of the wire capacitors used to store charge becomes larger than when a single free wire is used. That is, the capacitance $C_R$ in equations (3) and (4) above becomes larger than when a single free wire is used. If, for example, the capacitance $C_R$ is assumed to be infinite in consideration of a case in which the ratio of free wires to a wire through which a signal is transmitted is very large, then the voltage $V_{INT\_LOW}$ in equation (3) may be represented as in equation (10) below and the voltage $V_{INT\_HIGH}$ in equation (4) may be represented as in equation (11) below.

$$V_{INT\_LOW} = \lim_{C_R \to \infty} \frac{C_R}{C_L + 2C_R} V_{DD} = \frac{1}{2} V_{DD} \quad (10)$$

$$V_{INT\_HIGH} = \lim_{C_R \to \infty} \frac{C_L + C_R}{C_L + 2C_R} V_{DD} = \frac{1}{2} V_{DD} \quad (11)$$

That is, it is found that the larger the capacitance of the wire capacitor of a free wire is, the closer to $V_{DD}/2$ the voltages $V_{INT\_LOW}$ and $V_{INT\_HIGH}$ are. When a single free wire is used to store charge of a single wire, $V_{INT\_LOW}$ is $V_{DD}/3$ and $V_{INT\_HIGH}$ is $2V_{DD}/3$ as indicated by equations (8) and (9) above. If a plurality of free wires is used, therefore, the voltage $V_{INT\_LOW}$ becomes larger than when a single free wire is used and the voltage $V_{INT\_HIGH}$ becomes smaller.

When the voltage $V_{INT\_HIGH}$ is small, a voltage drop due to discharging is small. If a plurality of free wires is used, therefore, power consumption may be more reduced than when a single free wire is used.

When the voltage $V_{INT\_LOW}$ is large, a voltage rise due to charging is small. If a plurality of free wires is used, therefore, power consumption may be more reduced than when a single free wire is used.

If the capacitance $C_R$ is infinite, in which case energy consumption is represented as in equations (6) and (7), energy consumption becomes $C_L V_{DD}^2/8$ both when the signal $V_{IN}1$ changes from 1 to 0 and when the signal $V_{IN}1$ changes from 0 to 1. If charge is not reused (the voltage during discharging or charging changes from 0 V to the power supply voltage $V_{DD}$), power consumption is represented as $C_L V_{DD}^2/2$, so the effect of reducing electric power due to the reuse of charge is about 1/4 (75%).

In FIGS. 14 to 16, since the wire capacitor of a single free wire or the wire capacitors of a plurality of free wires are used, power consumption may be suppressed with a circuit having a small area.

Since the selecting units 35-1 and 35-2 are provided as illustrated in FIGS. 14 to 16, to reduce power consumption, a selection may be made to enable the reuse of charge for, for example, a wire through which a signal with a high operation ratio is transmitted because power consumption would otherwise be increased. Alternatively, a selection may be made to disable reuse of charge for a wire through which a signal is transmitted that does not meet a timing restriction if a long delay is caused.

Next, a method of designing the semiconductor integrated circuit 10, which enables the reuse of charge as described above, will be described.

Method of Designing the Semiconductor Integrated Circuit 10

Figure 17:
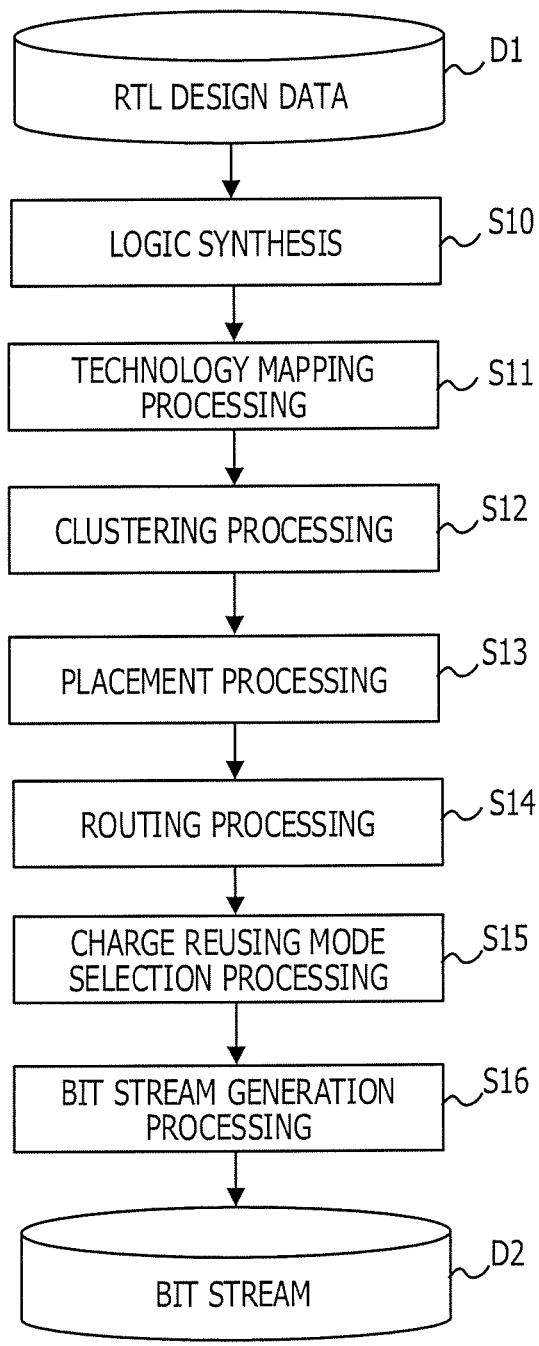
FIG. 17 is a flowchart illustrating an example of a method of designing the semiconductor integrated circuit in the second embodiment.

FIG. 17 is a flowchart illustrating an example of a method of designing the semiconductor integrated circuit in the second embodiment.

First, register transfer level (RTL) design data D1 is converted to a net list through logic synthesis (step S10). The RTL design data D1 is written in Verilog-Hardware Description Language (HDL), Very High-speed Integrated Circuit HDL (VHDL), or another hardware description language. In processing in step S10, high-level synthesis may be performed for a description in SystemC, C, or C++.

Technology mapping processing and clustering processing are performed next (steps S11 and S12). In technology mapping, combinational circuits are mapped to the LUT in a basic logic element (see FIG. 8) and registers are mapped to flip flops. In clustering processing, a plurality of basic elements is collectively mapped to a CLB (see FIG. 7).

Then, placement processing is performed (step S13). In placement processing, the position of the CLB on the FPGA is determined.

Upon completion of placement processing, routing processing with the reuse of charge taken into consideration is performed (step S14) and charge recycling mode selection processing is performed in which a wire for which to enable the reuse of charge is determined in consideration of a timing restriction (step S15). If the reuse of charge is enabled, a longer delay is generated than when the reuse of charge is disabled. If the reuse of charge is enabled for as many wires as possible within a range in which the timing restriction is met, therefore, much more power consumption may be reduced.

Then, bit stream generation processing is performed (step S16). In bit stream generation processing, bit stream (binary data) D2 used to configure the FPGA is generated.

The above design method is executed in, for example, a design apparatus as described below.

Example of a Design Apparatus

Figure 18:
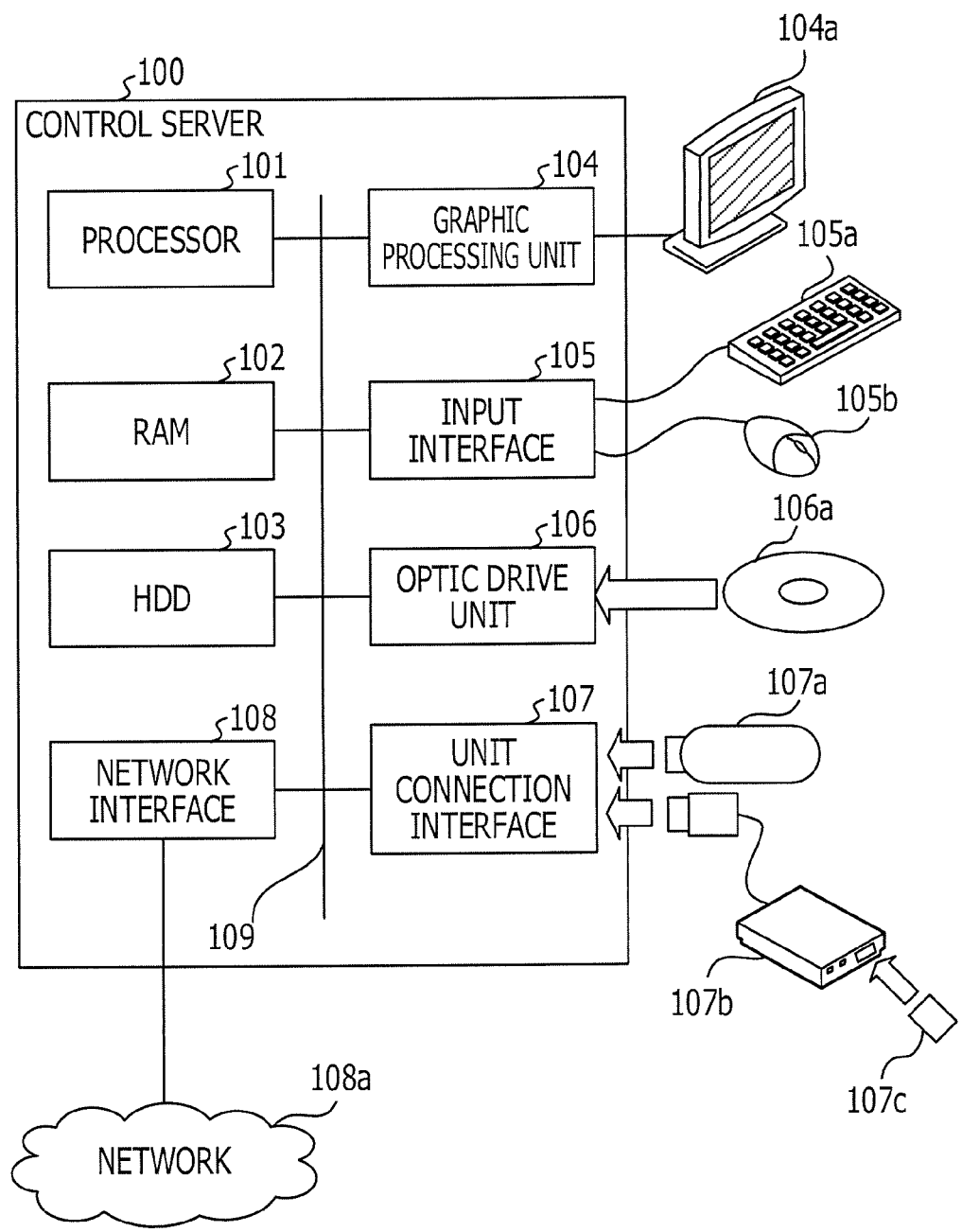
FIG. 18 illustrates an example of a hardware structure of a design apparatus.

FIG. 18 illustrates an example of a hardware structure of a design apparatus.

A design apparatus 100 is, for example, a computer as illustrated in FIG. 18. The whole of the design apparatus 100 is controlled by a processor 101. A random access memory (RAM) 102 and a plurality of peripherals are connected to the processor 101 through a bus 109. The processor 101 may be a multi-processor. For example, the processor 101 is a central processing unit (CPU), a micro processing unit (MPU), a digital signal processor (DSP), an ASIC, or a programmable logic device (PLD). Alternatively, the processor 101 may be a combination of at least two of the CPU, MPU, DSP, ASIC, and PLD.

The RAM 102 is used as a main storage unit of the design apparatus 100. The RAM 102 temporarily stores at least part of an operating system (OS) and application programs, the OS and application programs being executed by the processor 101. The RAM 102 also store various types of data used in processing executed by the processor 101.

Peripherals connected to the bus 109 include a hard disk drive (HDD) 103, a graphic processing unit 104, an input interface 105, an optic drive unit 106, a unit connection interface 107, and a network interface 108.

The HDD 103 magnetically writes and reads data to and from a built-in disk. The HDD 103 is used as an auxiliary storage unit of the design apparatus 100. The HDD 103 stores the OS, application programs, and various types of data. A flash memory or another semiconductor storage unit may also be used as the auxiliary storage unit.

A monitor 104a is connected to the graphic processing unit 104. The graphic processing unit 104 displays an image on the screen of the monitor 104a in response to a command from the processor 101. Examples of the monitor 104a include a display unit that uses a cathode ray tube (CRT) and a liquid crystal display unit.

A keyboard 105a and a mouse 105b are connected to the input interface 105. The input interface 105 receives signals from the keyboard 105a and mouse 105b and transmits the received signals to the processor 101. The mouse 105b is only an example of a pointing device; another pointing device may also be used. Other pointing devices include a touch panel, a tablet, a touch pad, and a trackball.

The optic drive unit 106 uses, for example, laser light to read data recorded on an optic disk 106a. The optic disk 106a is a portable recording medium on which data has been recorded in such a way that the data may be read through light reflection. Examples of the optic disk 106a include a digital versatile disc (DVD), a DVD-RAM, a compact disc read-only memory (CD-ROM), and a CD recordable/rewritable (CD-R/RW).

The unit connection interface 107 is a communication interface through which peripheral units are connected to the design apparatus 100. A memory unit 107a and a memory reader/writer 107b, for example, may be connected to the unit connection interface 107. The memory unit 107a has a recording medium on which a function to communicate with the unit connection interface 107 is mounted. The memory reader/writer 107b is a unit that writes and reads data to and from a memory card 107c. The memory card 107c is a card-type recording medium.

The network interface 108 is connected to a network 108a. The network interface 108 transmits and receives data to and from another computer or a communication unit through the network 108a.

With the hardware structure described above, the design method illustrated in FIG. 17 may be implemented.

The design apparatus 100 implements the above design method by executing a program recorded on, for example, a computer-readable recording medium. The program in which processing to be executed by the design apparatus 100 is coded may be recorded in advance in any of various recoding media. For example, the program to be executed by the design apparatus 100 may be stored in advance in the HDD 103. To have the design apparatus 100 execute the program in the HDD 103, the processor 101 loads at least part of the program from the HDD 103 into the RAM 102. It is also possible to record the program to be executed by the design apparatus 100 in advance in the optic disk 106a, the memory unit 107a, the memory card 107c, or another portable recording medium. The program stored in the portable recording medium is installed in the HDD 103 under control of, for example, the processor 101, making the program executable. It is also possible for the processor 101 to read the program directly from the portable recording medium and execute the program.

An example of routing processing in step S14 in FIG. 17 will be described.

Example of Routing Processing

Figure 19:
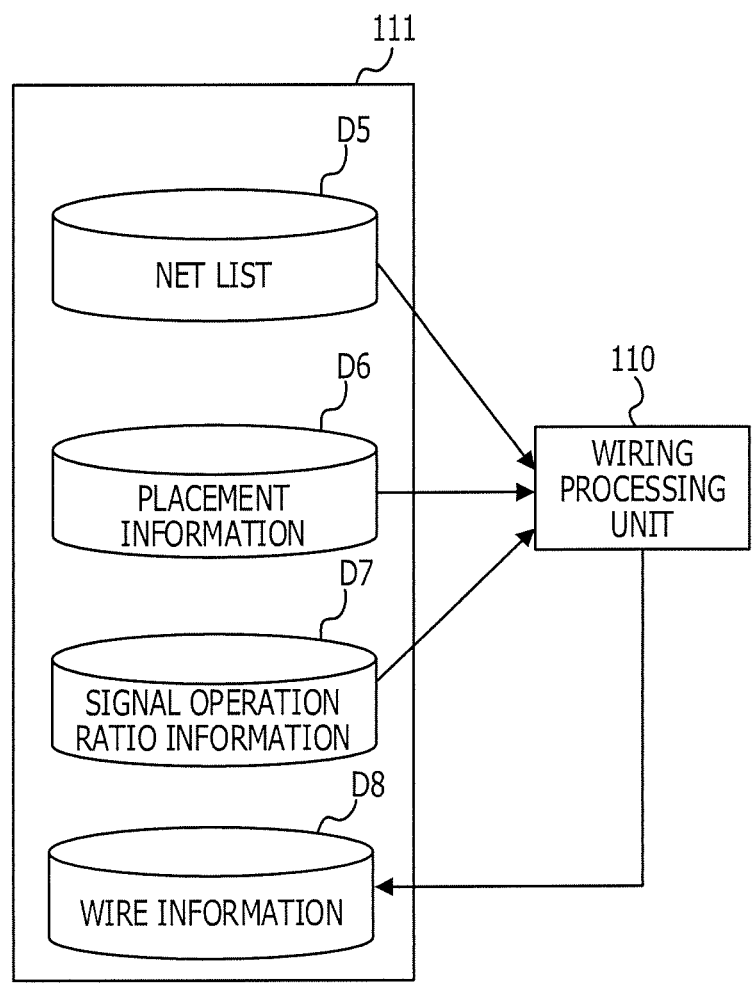
FIG. 19 illustrates an example of a functional block that performs routing processing.

FIG. 19 illustrates an example of a functional block that performs routing processing.

The functional block in FIG. 19 includes a routing processing unit 110 and a storage unit 111. The routing processing unit 110 obtains a slack ratio described later and the like according to a net list D5, placement information D6, and signal operation ratio information D7, which are stored in the storage unit 111, performs routing processing, creates routing information D8, and stores the routing information D8 in the storage unit 111.

The routing processing unit 110 and storage unit 111 are implemented by, for example, the processor 101, RAM 102, and HDD 103 in the design apparatus 100 in FIG. 18.

During routing processing, the routing processing unit 110 represents the internal wire structure of the FPGA as a directed graph.

Figure 20:
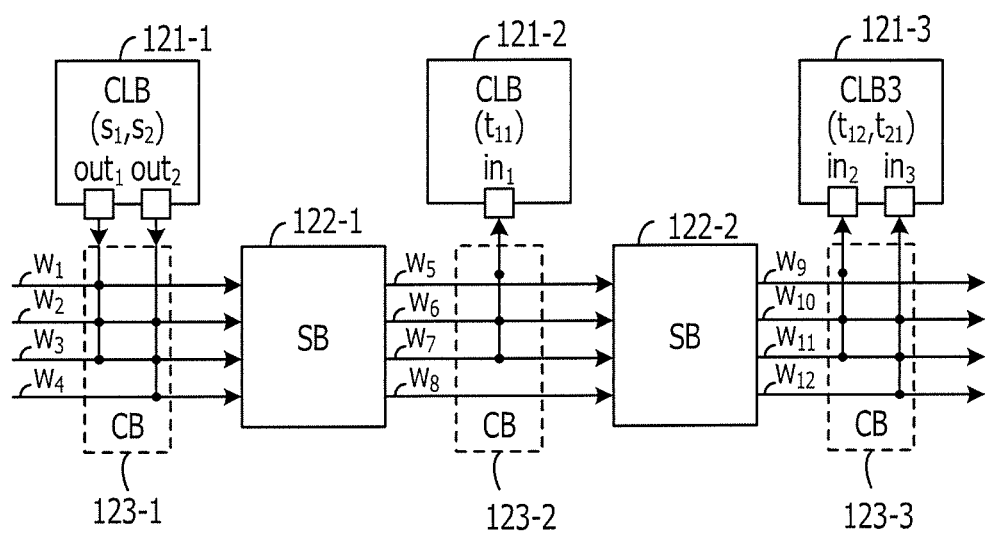
FIG. 20 illustrates an example of part of the wire structure of an FPGA.

FIG. 20 illustrates an example of part of the wire structure of the FPGA.

Figure 21:
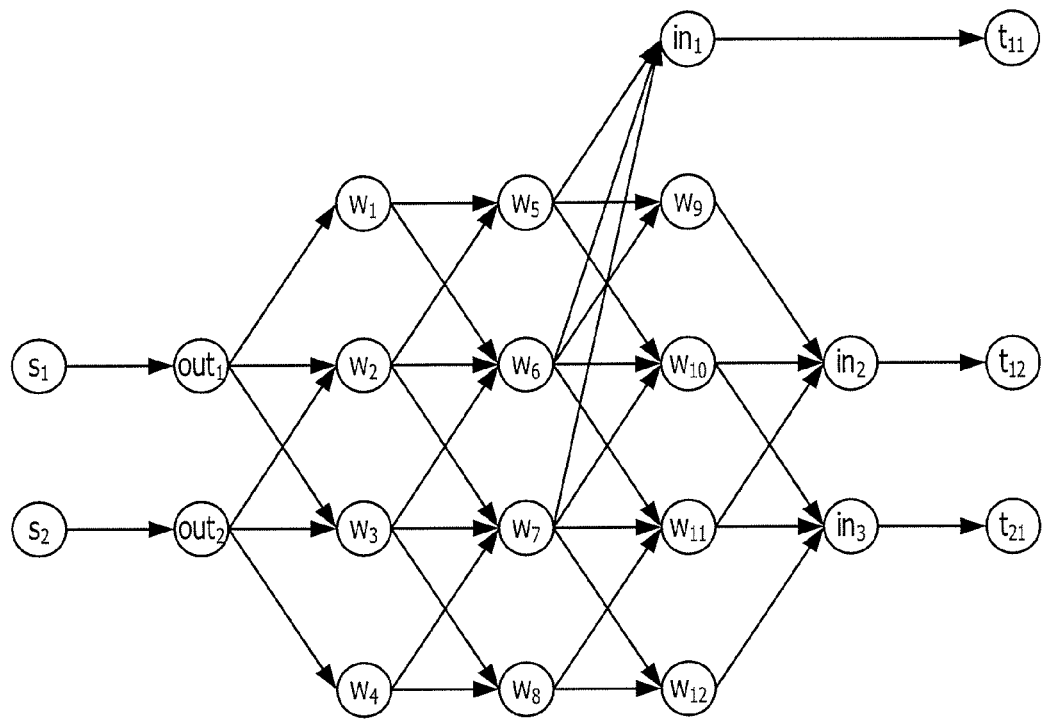
FIG. 21 illustrates an example of a directed graph corresponding to the wire structure in FIG. 20.

FIG. 21 illustrates an example of a directed graph corresponding to the wire structure in FIG. 20.

In the wire structure in FIG. 20, an output terminal $out_1$ of the CLB 121-1 is connected to wires $w_1$, $w_2$, and $w_3$ by the CB 123-1, an output terminal $out_2$ of the CLB 121-1 is connected to wires $w_2$, $w_3$, and $w_4$ by the CB 123-1, an input terminal $in_1$ of the CLB 121-2 is connected to wires $w_5$, $w_6$, and $w_7$ by the CB 123-2, an input terminal $in_2$ of the CLB 121-3 is connected to wires $w_9$, $w_{10}$, and $w_{11}$ by the CB 123-3, and an input terminal $in_3$ of the CLB 121-3 is connected to wires $w_{10}$, $w_{11}$, and $w_{12}$ by the CB 123-3. The SB 122-1 switches wire connections between the wires $w_1$ to $w_4$ and wires $w_5$ to $w_8$. The SB 122-2 switches wire connections between the wires $w_5$ to $w_8$ and wires $w_9$ to $w_{12}$.

In FIG. 20, the sources of signals are denoted $s_1$ and $s_2$ and their sinks are denoted $t_{11}$, $t_{12}$, and $t_{21}$.

In the directed graph in FIG. 21, paths from the sources $s_1$ and $s_2$ of signals to their sinks $t_{11}$, $t_{12}$, and $t_{21}$ are represented by using the output terminals $out_1$ and $out_2$, input terminals $in_1$ to $in_3$, and wires $w_1$ to $w_{12}$ as vertexes.

In this directed graph, a delay in each of the wires $w_1$ to $w_{12}$ is represented as a weight of a side that mutually connects vertexes. When a path between a source and a sink that minimizes a cost obtained by a cost function described later is obtained, an optimum assignment to signal wires may be determined.

Figure 22:
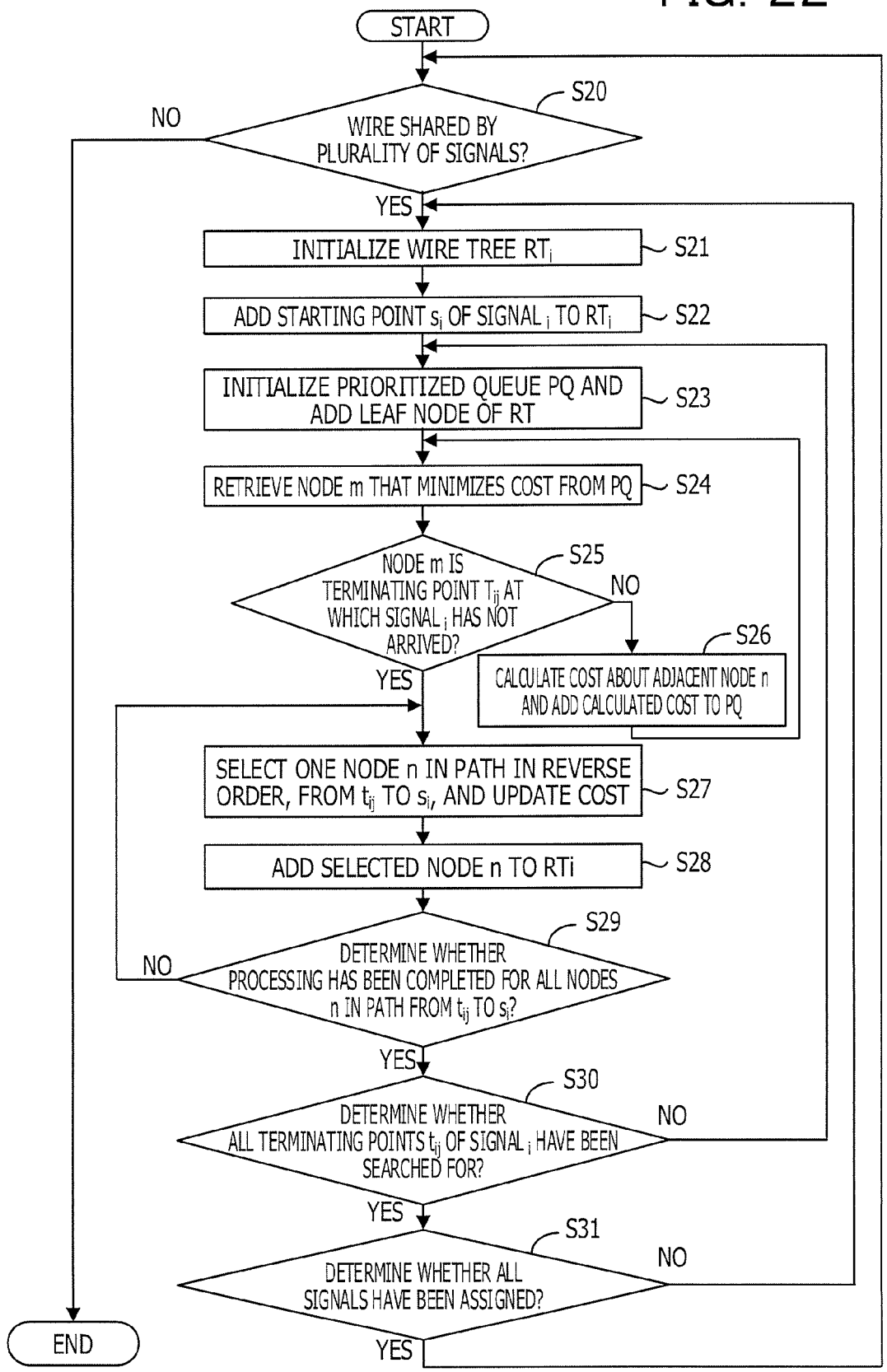
FIG. 22 is a flowchart illustrating an example of routing processing.

FIG. 22 is a flowchart illustrating an example of routing processing.

As a preparation, the routing processing unit 110 allows a plurality of signals to be assigned to a single wire and performs wire processing so as to minimize a delay.

First, the routing processing unit 110 determines whether there is a wire shared by a plurality of signals (step S20). If the routing processing unit 110 determines that there is a wire shared by a plurality of signals, the routing processing unit 110 performs processing in S21 and later. If the routing processing unit 110 determines that there is no wire shared by a plurality of signals, the routing processing unit 110 terminates the wire processing.

In processing in step S21, the routing processing unit 110 initializes a wire tree $RT_i$, which holds a path through which a signal i is transmitted. Upon completion of the initialization of the wire tree $RT_i$, the routing processing unit 110 adds the source $s_i$ of the path through which the signal i is transmitted to the wire tree $RT_i$ (step S22).

The routing processing unit 110 then uses a breadth first search method to search for a sink by a procedure described below.

The routing processing unit 110 initializes a prioritized queue PQ and adds a leaf node (sink) of the wire tree $RT_i$ to the prioritized queue PQ, assuming that the cost is 0 (step S23). The routing processing unit 110 then retrieves a node m that minimizes the cost from the prioritized queue PQ (step S24) and determines whether the node m is a sink $t_{ij}$ at which the signal i has not arrived (step S25).

If the routing processing unit 110 determines that the node m is not the sink $t_{ij}$ at which the signal i has not arrived, the routing processing unit 110 calculates a cost about a node n adjacent to the node m and adds the calculated cost to the prioritized queue PQ (step S26). An example of processing in S26 will be described later. Upon completion of processing in step S26, the routing processing unit 110 repeatedly executes processing in step S24 and later.

If the routing processing unit 110 determines that the node m is the sink $t_{ij}$ at which the signal i has not arrived, the routing processing unit 110 selects one node n included in the path in a reverse order, that is, from the sink $t_{ij}$ to the source $s_i$, and updates the cost (step S27), after which the routing processing unit 110 adds the selected node n to the wire tree $RT_i$ (step S28).

The routing processing unit 110 determines whether processing has been completed for all nodes n in the path from the sink $t_{ij}$ to the source $s_i$ (step S29). If the routing processing unit 110 determines that processing has not been completed for all nodes n, the routing processing unit 110 repeatedly executes processing in step S27 and later.

If the routing processing unit 110 determines that processing has been completed for all nodes n in the path from the sink $t_{ij}$ to the source $s_i$, this indicates that a path from a certain point $s_i$ to a certain sink $t_{ij}$ has been obtained. The routing processing unit 110 then determines whether all sinks $t_{ij}$ of the signal i have been searched for (step S30). If there are a plurality of sinks $t_{ij}$ and at least one of the plurality of sinks $t_{ij}$ has not been searched for, the routing processing unit 110 repeatedly executes processing in step S23 and later.

If the routing processing unit 110 then determines that all sinks $t_{ij}$ have been searched for, the routing processing unit 110 determines whether all signals have been assigned to wires (step S31). Since the wire tree $RT_i$ only temporarily stores the path for the signal i, the wire tree $RT_i$ is initialized each time a wire has been assigned to one signal. If the routing processing unit 110 determines that all signals have not been assigned to wires, therefore, the routing processing unit 110 repeatedly executes processing in step S21 and later.

If the routing processing unit 110 determines that all signals have been assigned to wires, the routing processing unit 110 makes a determination in step S20 again. If there is a wire shared by a plurality of signals, the routing processing unit 110 executes routing processing again for all signals. The coefficient of the cost function changes according to the result of the previous routing processing, so in next routing processing, a signal passes through a path different from the previous path. When assignment of all signals to wires is repeatedly executed, finally there is no more wire shared by a plurality of signals. This completes routing processing.

Next, an example of processing in step S26 will be described for a case in which a wire used to store charge is not changed (see FIG. 9) and a case in which a wire used to store charge may be arbitrarily changed (see FIG. 14).

Figure 23:
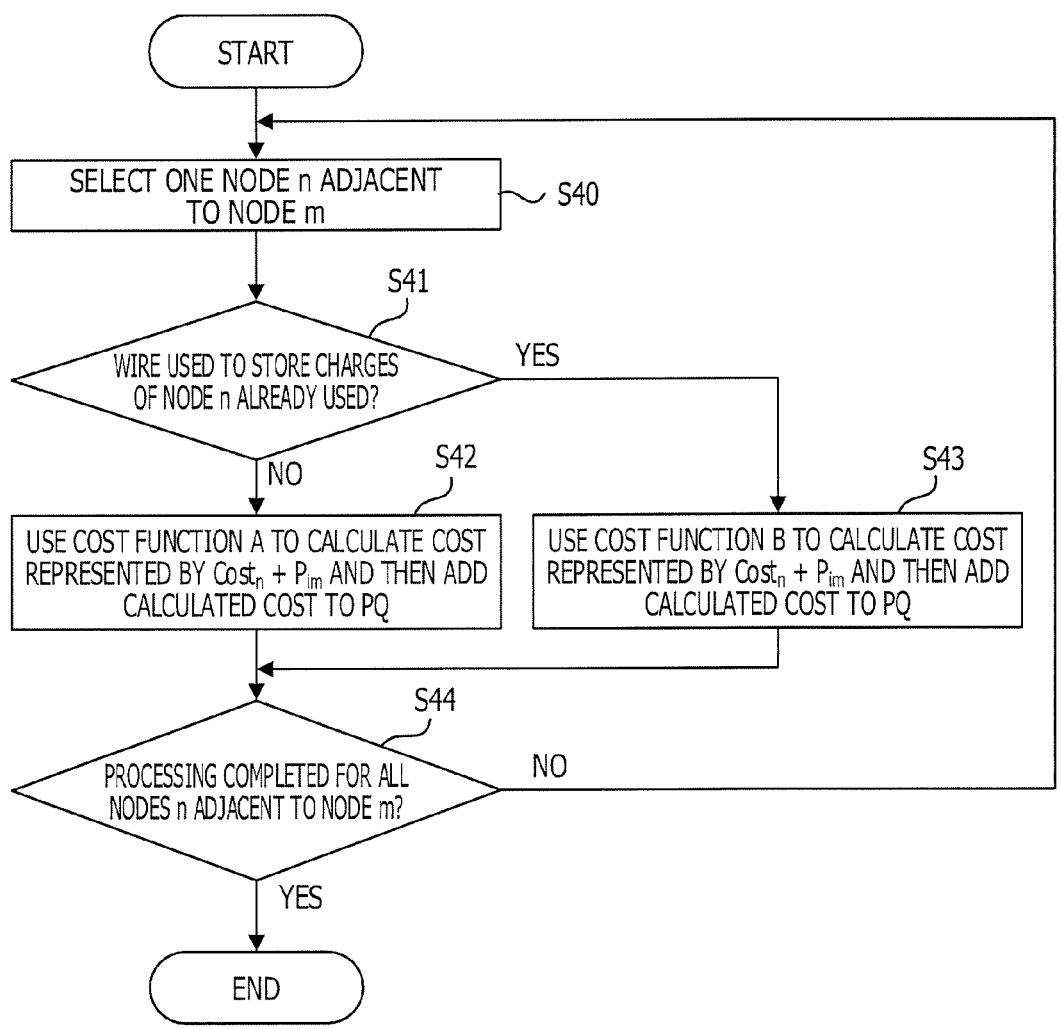
FIG. 23 is a flowchart illustrating an example of cost calculation concerning a node n adjacent to a node m and addition processing to add the calculated cost to a prioritized queue PQ in a case in which a wire used to store charge is not changed.

When a Wire Used to Store Charge is Fixed:

FIG. 23 is a flowchart illustrating an example of cost calculation concerning the node n adjacent to the node m and addition processing to add the calculated cost to the prioritized queue PQ in a case in which a wire used to store charge is fixed.

The routing processing unit 110 selects one node n adjacent to the node m that is a candidate to which the signal i is to be assigned (step S40), after which the routing processing unit 110 determines whether the wire used to store charge of the node n has been already used as a candidate to which another signal j is to be assigned (step S41).

If the wire used to store charge of the node n has not been used, the routing processing unit 110 uses cost a function A to calculate a cost represented by $\text{Cost}_n + P_{im}$ and adds the calculated cost to the prioritized queue PQ (step S42). $\text{Cost}_n$ is the cost of the node n and $P_{im}$ is a cost taken from the source $s_i$ to the node m.

In processing in step S42, the routing processing unit 110 uses the Pathfinder method (see Document 4) to calculate $\text{Cost}_n$ as the cost function A according to equation (12) below.

$$\text{Cost}(n) = (1 - \text{Crit}(i)) \cdot \text{cong\_cost}(n) + \text{Crit}(i) \cdot \text{delay\_cost} \quad (12)$$

In equation (12), Crit (i), which is represented as in equation (13) below, represents the slack ratio of the signal i.

$$\text{Crit}(i) = \frac{\text{delay}_i}{\text{delay}_{max}} \quad (13)$$

In equation (13), $\text{delay}_i$ indicates a delay of the signal i and $\text{delay}_{max}$ indicates the maximum delay among all signals. Therefore, Crit(i) is greater than 0 but is at most 1. The closer to the maximum delay the delay of the signal i is (the smaller a margin in timing is), the closer to 1 Crit(i) is; the further away from the maximum delay the delay of the signal i is (the larger a margin in timing is), the closer to 0 Crit(i) is.

In equation (12), cong_cost(n) indicates the degree of congestion at the node n; the more signals the node n is assigned as a candidate, the larger the value of cong_cost(n) is. delay_cost(n) indicates the delay of a wire n.

As described above, in processing in step S24 in FIG. 22, the node m that minimizes the cost is retrieved. When the timing of the signal i is critical as in equation (12) (Crit(i) is close to 1), delay_cost(n) becomes dominant in terms of cost. Therefore, the shorter the delay of the node n is, the less the cost is, so the node n is more likely to be selected in processing in step S24.

The larger a margin in timing is (the closer to 0 Crit(i) is), the more dominant cong_cost(n) is and the lower the degree of congestion at the node n is, the less the cost is. That is, as the degree of congestion at the node n becomes lower, the node n is more likely to be selected in processing in step S24.

If the wire used to store charge of the node n has been already used, the routing processing unit 110 uses a cost function B to calculate a cost represented by $\text{Cost}_n + P_{im}$ and adds the calculated cost to the prioritized queue PQ (step S43).

In processing in step S43, the routing processing unit 110 calculates $\text{Cost}_n$ as the cost function B according to equation (14) below.

$$\text{Cost}(n) = (1 - \text{Crit}(i)) \cdot [\text{cong\_cost}(n) + (1 - \alpha_i) \cdot \text{res\_cost}(n) + \alpha_i \cdot PF] + \text{Crit}(i) \cdot \text{delay\_cost}(n) \quad (14)$$

In equation (14), $\alpha_i$ is the operation ratio of the signal i, PF is an adjustment constant, and res_cost(n) is represented as in equation (15) below.

$$\text{res\_cost}(n) = (1 - \text{Crit}(j)) \cdot \alpha_j \quad (15)$$

In equation (15), j indicates the index of a signal that has been assigned to a wire used to store charge of the node n, which is a candidate to which the signal i is to be assigned.

When the timing of the signal i is critical as in equation (14) (Crit(i) is close to 1), delay_cost(n) becomes dominant in terms of cost. Therefore, the longer the delay of the node n is, the more the cost is, so the node n is less likely to be selected as a candidate of a path for the signal i in processing in step S24. Due to the reason described above, the wire used to reuse charge causes a large delay. If the original delay (wire delay) of the node n is long, therefore, this processing makes the node n hard to select as a candidate of a path for the signal i. This suppresses the reuse of charge from being executed for the node n having a long delay, so it is possible to suppress a margin in timing from being more reduced.

By contrast, if the delay of the node n is short, the node n is likely to be selected as a candidate of the path for the signal i in processing in step S24. If charge is reused for the node n, therefore, power consumption may be reduced.

If there is a margin in the timing of the signal i (Crit(i) is close to 0), the larger the operation ratio $\alpha_i$ of the signal i is, the more dominant the values of cong_cost(n) and $\alpha_i \cdot PF$ are. If cong_cost(n) is unchanged and the value of $\alpha_i \cdot PF$ is dominant, this indicates that PF has been appropriately adjusted so that the cost is reduced. In processing in step S24, therefore, the node n is likely to be selected as a candidate of the path for the signal i. That is, the node n is likely to be selected as a candidate of the path for the signal i and charge is reused for the node n, so power consumption may be reduced.

If there is a margin in the timing of the signal i and the operation ratio of the signal i is low, the values of cong_cost(n) and res_cost(n) are dominant. If cong_cost(n) is unchanged and there is a margin in the timing of the signal j (Crit(j) is close to 0), when the operation ratio of the signal j already assigned to a wire used to store charge is high, the cost becomes high.

In processing in step S24, therefore, the node n is less likely to be selected as a candidate of the path for the signal i. Then, a wire, at the node n, used to store charge is likely to be selected as part of a path through which the signal j is transmitted, enabling the reuse of charge to be easily performed for a wire through which the signal j is transmitted. When the reuse of charge is performed, as described above, for a wire through which the signal j with a high operation ratio is transmitted, the effect of reducing power consumption is increased.

Upon completion of processing in steps S42 and S43, the routing processing unit 110 determines whether processing has been completed for all nodes n adjacent to the node m (step S44).

If the routing processing unit 110 determines that processing has not been completed for all nodes n adjacent to the node m, the routing processing unit 110 repeatedly executes processing in step S40 and later. If the routing processing unit 110 determines that processing has been completed for all nodes n adjacent to the node m, the routing processing unit 110 terminates cost calculation concerning the node n adjacent to the node m and addition processing to add the calculated cost to the prioritized queue PQ.

Figure 24:
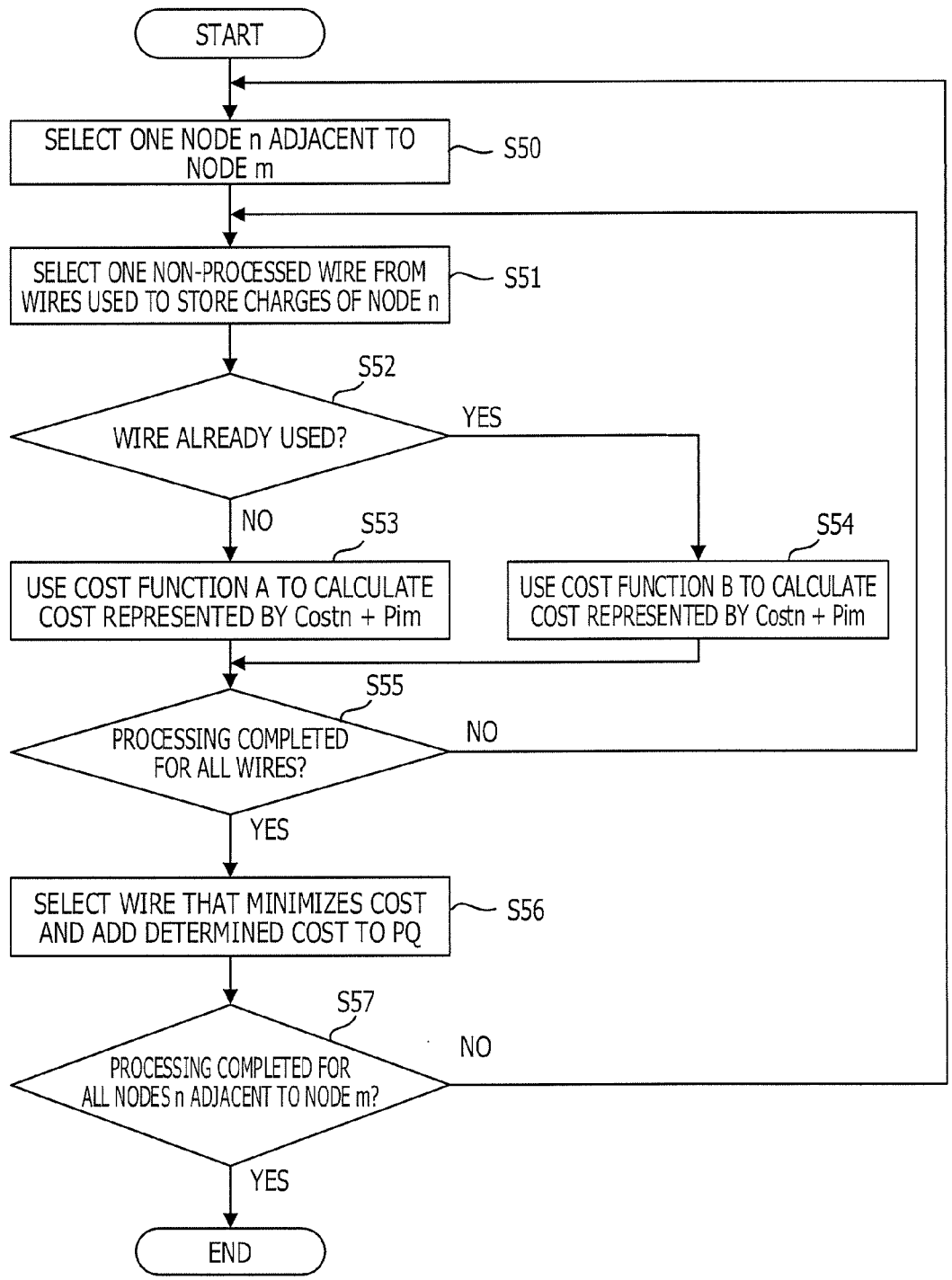
FIG. 24 is a flowchart illustrating an example of cost calculation concerning the node n adjacent to the node m and addition processing to add the calculated cost to the prioritized queue PQ in a case in which a wire used to store charge may be arbitrarily changed.

When a Wire Used to Store Charge May be Arbitrarily Changed:

FIG. 24 is a flowchart illustrating an example of cost calculation concerning the node n adjacent to the node m and addition processing to add the calculated cost to the prioritized queue PQ in a case in which a wire used to store charge may be arbitrarily changed.

The routing processing unit 110 selects one node n adjacent to the node m that is a candidate to which the signal i is to be assigned (step S50), after which the routing processing unit 110 selects one non-processed wire from wires used to store charge of the node n (step S51).

The routing processing unit 110 then determines whether the wire used to store charge of the node n has been already used as a candidate to which another signal j is to be assigned or as a candidate of a wire used to store charge used by a wire through which the other signal j is transmitted (step S52).

If the wire used to store charge of the node n has not been used, the routing processing unit 110 uses the cost function A represented as in equations (12) and (13) above to calculate the cost represented by $Cost_n + P_{im}$ (step S53).

If the wire used to store charge of the node n has been already used, the routing processing unit 110 uses the cost function B represented as in equations (14) and (15) above to calculate the cost represented by $Cost_n + P_{im}$ (step S54).

In equation (15) in processing in FIG. 24, j indicates the index of a signal that has been already assigned to a wire selected in processing in step S51 to store charge or a signal that is transmitted through another wire that uses the wire used to store charge.

When the timing of the signal i is critical or when there is a margin for the timing of the signal i and the operation ratio $\alpha_i$ of the signal i is large, the same effect as in the case, described above, in which a wire used to store charge is not changed may be obtained.

If there is a margin in the timing of the signal i and the operation ratio $\alpha_i$ of the signal i is low, the values of cong_cost(n) and res_cost(n) are dominant. At this time, if the operation ratio $\alpha_j$ of the signal j described above is large, the cost becomes high. Therefore, the node n is less likely to be selected as a candidate of a path for the signal i in processing in step S24. Then, a wire, at the node n, used to store charge is likely to be selected as part of a path through which the signal j is transmitted or as a wire used to store charge of the wire through which the signal j is transmitted. When the reuse of charge is easily applied to a wire through which the signal j with a high operation ratio is transmitted as described above, the effect of reducing power consumption is increased.

Upon completion of processing in steps S53 and S54, the routing processing unit 110 determines whether processing in steps S51 to S54 has been completed for all wires, at the node n, used to store charge (step S55).

If the routing processing unit 110 determines that processing in steps S51 to S54 has not been completed for all wires, at the node n, used to store charge, the routing processing unit 110 repeatedly executes processing in step S51 and later.

If the routing processing unit 110 determines that processing in steps S51 to S54 has been completed for all wires, at the node n, used to store charge, the routing processing unit 110 selects the wire that minimizes the cost from all wires and adds the determined cost to the prioritized queue PQ (step S56).

Then, the routing processing unit 110 determines whether processing in steps S50 to S56 has been completed for all nodes n adjacent to the node m (step S57).

If the routing processing unit 110 determines that processing in steps S50 to S56 has not been completed for all nodes n adjacent to the node m, the routing processing unit 110 repeatedly executes processing in step S50 and later.

If the routing processing unit 110 determines that processing in steps S50 to S56 has been completed for all nodes n adjacent to the node m, the routing processing unit 110 terminates cost calculation concerning the node n adjacent to the node m and addition processing to add the calculated cost to the prioritized queue PQ.

An example of charge recycling mode selection processing S15 in FIG. 17 will be described below.

Example of Charge Recycling Mode Selection Processing

Figure 25:
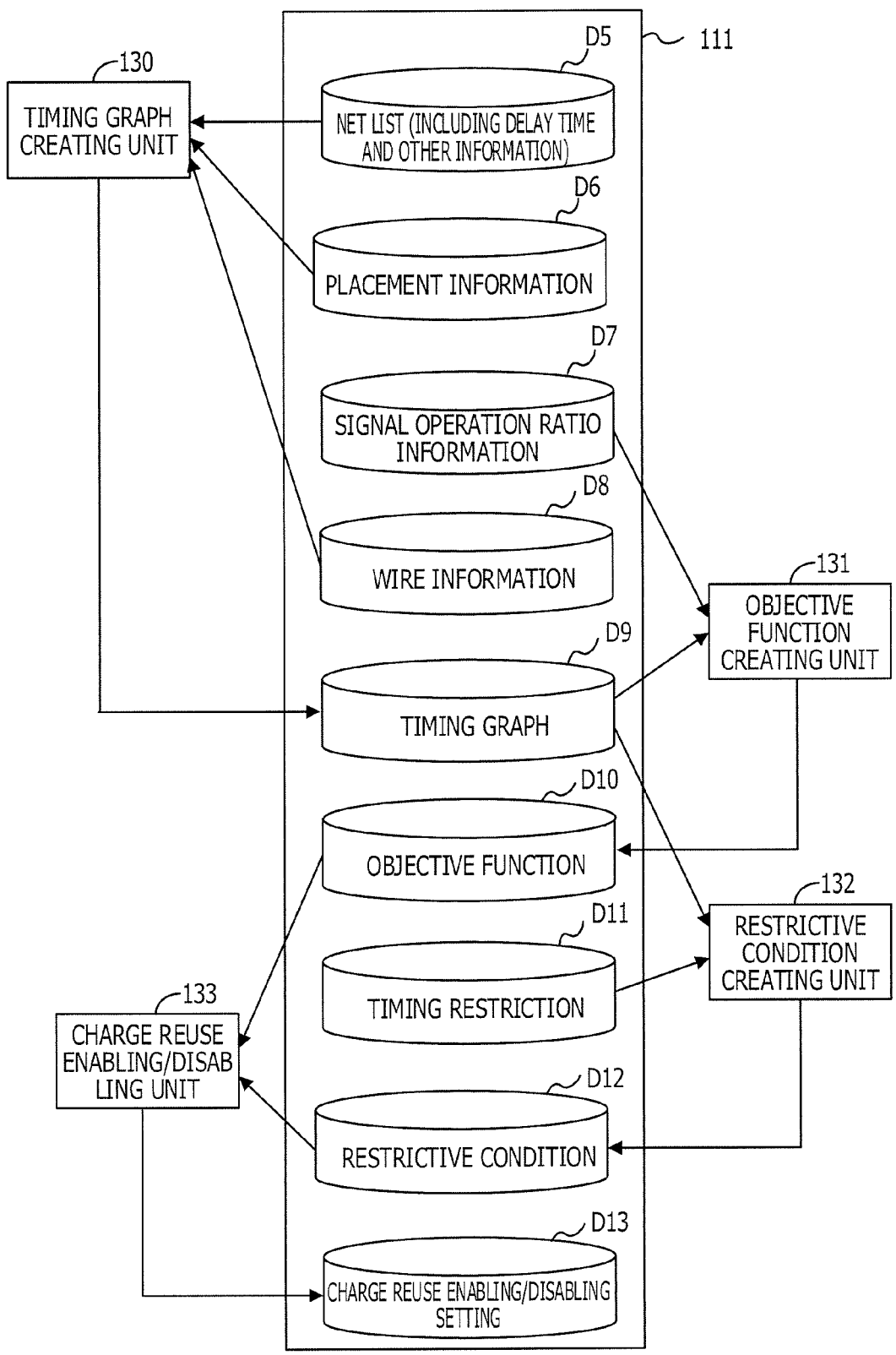
FIG. 25 illustrates an example of a functional block that performs charge recycling mode selection processing.

FIG. 25 illustrates an example of a functional block that performs charge recycling mode selection processing.

In addition to the storage unit 111 in FIG. 19, FIG. 25 illustrates a timing graph creating unit 130, an objective function creating unit 131, a restrictive condition creating unit 132, and a charge reuse enabling/disabling unit 133.

The timing graph creating unit 130 creates a timing graph D9 according to the net list D5, placement information D6, and wire information D8, which are stored in the storage unit 111, and stores the crated timing graph D9 in the storage unit 111.

The objective function creating unit 131 creates an objective function D10 according to the signal operation ratio information D7 and timing graph D9, which are stored in the storage unit 111, and stores the crated objective function D10 in the storage unit 111.

The restrictive condition creating unit 132 creates a restrictive condition D12 for each node according to the timing graph D9 and timing restriction D11, which are stored in the storage unit 111, and stores the created restrictive condition D12 in the storage unit 111.

The charge reuse enabling/disabling unit 133 creates a charge reuse enabling/disabling setting D13 according to the objective function D10 and restrictive condition D12, which are stored in the storage unit 111, and stores the created charge reuse enabling/disabling setting D13 in the storage unit 111. The charge reuse enabling/disabling unit 133 in the second embodiment is a mixed integer linear programming (MILP) solver, which uses a MILP method to determine which wire is eligible for the reuse of charge.

The timing graph creating unit 130, objective function creating unit 131, restrictive condition creating unit 132, charge reuse enabling/disabling unit 133, and storage unit 111 may be implemented by, for example, the processor 101, RAM 102, HDD 103, and other components in the design apparatus 100 illustrated in FIG. 18.

An example of determining a wire for which to enable the reuse of charge will be described below.

Figure 26:
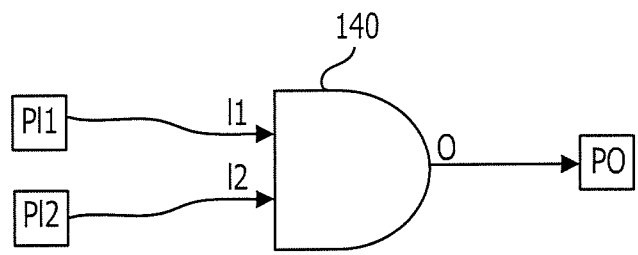
FIG. 26 illustrates an example of a logic circuit represented by a timing graph.

FIG. 26 illustrates an example of a logic circuit represented by a timing graph.

The AND circuit 140 in FIG. 26 generates a logical product of signals I1 and I2 received at terminals PI1 and PI2 and outputs the logical product to a terminal PO as a signal O.

The timing graph creating unit 130 creates a timing graph as described below from a logic circuit as illustrated in FIG. 26 according to the net list D5, placement information D6, and wire information D8.

Figure 27:
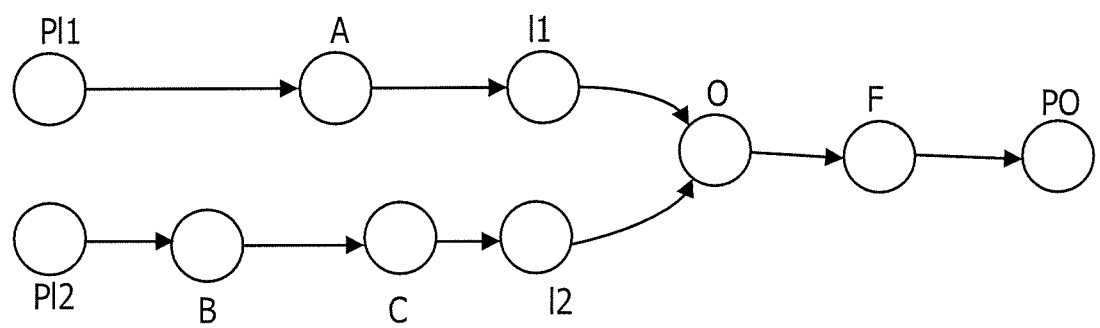
FIG. 27 illustrates an example of a created timing graph.

FIG. 27 illustrates an example of a created timing graph.

In the timing graph G(V, E) in FIG. 27, a combinational circuit is illustrated in which each vertex of the graph is resented by a wire and a terminal of the logic circuit and each side of the graph is presented by a programmable switch and an LUT.

Then, a delay $D_V$ of a certain wire (vertex) v in a set V of vertexes is represented as in equation (16) below.

$$D_v = DIntrinsic_v + \gamma_v \cdot \delta_v \quad (16)$$

In equation (16), $DIntrinsic_v$ represents a delay in a case in which charge is not reused, $\gamma_v$ represents a binary (0 and 1) variable, which indicates whether a wire v uses the charge recycling mode (whether the reuse of charge is enabled or disabled), and $\delta_v$ represents a delay that is added when the reuse of charge is enabled.

A delay between an input to a certain vertex v in the worst case is represented as in equation (17) below.

$$Arr_v \geq \forall_{(u,v) \in E} Arr_u + D_v \quad (17)$$

To determine the delay in the worst case, delays of all inputs to the vertex v may be determined by using a max function. Since, in the second embodiment, a mixed integer programming method is used, however, the delay in the worst case is represented as in equation (17) above. If only one input is used, the inequality sign in equation (17) is removed.

If a subset of the set V that is an end of a combinational circuit (such as the output terminal of an entire circuit or input terminals of flip flops) is denoted CO and a user-defined timing restriction is denoted T, the restrictive condition creating unit 132 generates a restrictive condition represented as in equation (18) below.

$$\forall_{v \in CO} Arr_v \le T \quad (18)$$

If wires (including free wires) to which the reuse of charge is applicable, these wires being a subset of the set V, is denoted CR, the objective function creating unit 131 creates an objective function represented as in equation (19) below.

$$\phi = \sum_{i \in CR} \alpha_i \cdot \gamma_i - \sum_{j \in V} Arr_j \quad (19)$$

In equation (19), $\alpha_i$ indicates the operation ratio of a vertex i, the first item represents the number of wires to which the reuse of wires is applicable, each wire being weighted by the operation ratio, and the next item represents the sum of delays.

When the charge reuse enabling/disabling unit 133 uses the conditions in equations (16) to (18) as well as equation (19) to determine γ that maximizes Φ by the mixed integer programming method, the charge reuse enabling/disabling unit 133 may enable the reuse of charge for the largest number of wires.

If, in the timing graph G(V, E) in FIG. 27, wires are denoted A, B, C, and D, the $DIntrinsic_v$ of each wire is 1 ns, and its $\delta_v$ is 0.5 ns, then equations (16) may be rewritten as equation (20) and equation (17) may be rewritten as equation (21).

$$D_{PI1} = D_{PI2} = 0$$

$$D_A = 1 + \gamma_A \cdot 0.5$$

$$D_B = 1 + \gamma_B \cdot 0.5$$

$$D_C = 1 + \delta_C \cdot 0.5$$

$$D_F = 1 + \gamma_F \cdot 0.5$$

$$D_{I1} = D_{I2} = 0$$

$$D_O = 2$$

$$D_{PO} = 0 \quad (20)$$

$$Arr_A = Arr_{PI1} + D_A$$

$$Arr_B = Arr_{PI2} D_B$$

$$Arr_C = Arr_B + D_C$$

$$Arr_{I1} = Arr_A + D_{I1}$$

$$Arr_{I2} = Arr_C + D_{I2}$$

$$Arr_O \ge Arr_{I1} + D_O$$

$$Arr_O \ge Arr_{I2} + D_O$$

$$Arr_F = Arr_O + D_F$$

$$Arr_{PO} = Arr_F + D_{PO} \quad (21)$$

If the timing restriction T is 5 ns, then equation (22) may be obtained from equation (18) as a restrictive condition.

$$Arr_{PO} \le 5 \quad (22)$$

The objective function is represented as in equation (23) below.

$$\Phi = \gamma_A + \gamma_B + \gamma_C + \gamma_F - Arr_O \quad (23)$$

The charge reuse enabling/disabling unit 133 determines a solution that enables the reuse of charge for the largest number of wires by using the mixed integer programming method according to the restrictive condition in equations (22) and the objective function in equation (23).

In the solution in the above example, $\gamma_A$ is 1, $\gamma_B$ is 0, $\gamma_C$ is 0, and $\gamma_F$ is 0. If the reuse of charge is enabled for the wire A and is disabled for the wires B, C and F, the result is that the reuse of charge may be enabled for the largest number of wires without violating the timing restriction.

Thus, electric power may be more reduced without violating the timing conditions.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor integrated circuit comprising:
   a first wire through which a signal is transmitted;
   a first capacitor having a first terminal coupled to the first wire and a second terminal that is grounded;
   a second wire that is not used for signal transmission;
   a second capacitor having a first terminal coupled to the second wire and a second terminal that is grounded;
   a first switch that creates or breaks an electric connection between the first wire and the second wire; and
   a control circuit that includes:
     a high side switch having a first terminal supplied with a power supply voltage and a second terminal coupled to the first wire, and
     a low side switch having a first terminal coupled to the first wire and a second terminal that is grounded, wherein:
       the control circuit is configured to turn on the high side switch and to turn off the low side switch and the first switch when the signal is high level,
       the control circuit is configured to turn off the high side switch and the low side switch and to turn on the first switch when the signal is changed from the high level to low level, and
       the control circuit is configured to turn on the low side switch and to turn off the first switch when the signal is the low level.

2. The semiconductor integrated circuit according to claim 1, further comprising:

a selector that selects the first wire and the second wire from a plurality of wires, wherein the selector couples the selected first wire to the second wire through the first switch.

3. The semiconductor integrated circuit according to claim 2, wherein the selector couples a plurality of second wires to a single first wire through the first switch.

4. The semiconductor integrated circuit according to claim 1, further comprising:

a delay circuit that delays the electric connection between the first wire and the second wire from being broken by the first switch according to a time taken until movement of charge is completed between the first capacitor and the second capacitor is completed.

5. The semiconductor integrated circuit according to claim 4, wherein the delay circuit enables or disables according to a signal setting to determine whether to reuse charge.

* * * * *